United States Patent
Amano et al.

(10) Patent No.: US 7,038,939 B2
(45) Date of Patent: May 2, 2006

(54) MAGNETO-RESISTANCE EFFECT ELEMENT AND MAGNETIC MEMORY

(75) Inventors: Minoru Amano, Kanagawa-Ken (JP); Tatsuya Kishi, Kanagawa-Ken (JP); Sumio Ikegawa, Tokyo (JP); Yoshiaki Saito, Kanagawa-Ken (JP); Hiroaki Yoda, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 10/696,000

(22) Filed: Oct. 30, 2003

(65) Prior Publication Data

US 2004/0141367 A1    Jul. 22, 2004

(30) Foreign Application Priority Data

Oct. 31, 2002  (JP) .............................. 2002-318965

(51) Int. Cl.
*G11C 11/00* (2006.01)
(52) U.S. Cl. ..................... 365/158; 365/171; 365/173; 365/230.07
(58) Field of Classification Search ................ 365/158, 365/171, 173, 230.07
See application file for complete search history.

(56) References Cited

U.S. PATENT DOCUMENTS 5,659,499 A    8/1997  Chen et al.
6,510,078 B1*  1/2003  Schwarzl ..................... 365/185
6,556,473 B1   4/2003  Saito et al.
6,650,513 B1* 11/2003  Fullerton et al. ........ 360/324.2
6,757,191 B1*  6/2004  Ooishi et al. ............... 365/171
6,803,615 B1* 10/2004  Sin et al. ..................... 257/295

FOREIGN PATENT DOCUMENTS

JP    2002-110938    4/2002

OTHER PUBLICATIONS

U.S. Appl. No. 10/696,000, filed Oct. 30, 2003, Amano et al.
U.S. Appl. No. 10/715,545, filed Nov. 19, 2003, Saito et al.
U.S. Appl. No. 10/933,323, filed Sep. 03, 2004, Fukuzumi et al.

\* cited by examiner

*Primary Examiner*—Connie C. Yoha
(74) *Attorney, Agent, or Firm*—Oblon, Spivak, McClelland, Maier & Neustadt, P.C.

(57) ABSTRACT

The magnetic memory includes a plurality of memory cells, each memory cell including: at least one writing wire; at least one data storage portion, provided on at least one portion of an outer periphery of the writing wire, which comprises a ferromagnetic material whose magnetization direction can be inverted by causing a current to flow in the writing wire; and at least one magneto-resistance effect element, disposed in the vicinity of the data storage portion, which senses the magnetization direction of the data storage portion.

12 Claims, 17 Drawing Sheets

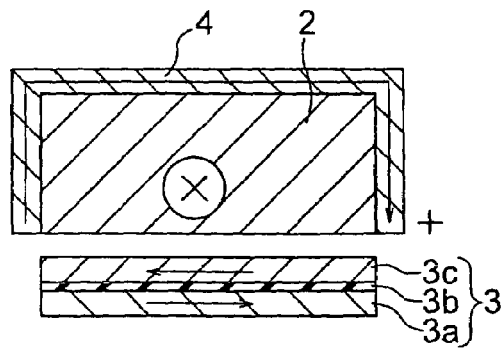
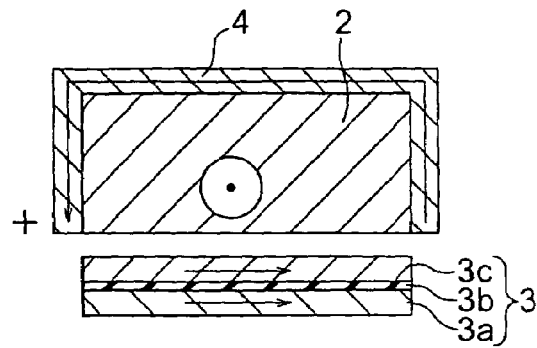
FIG. 1A  FIG. 1B
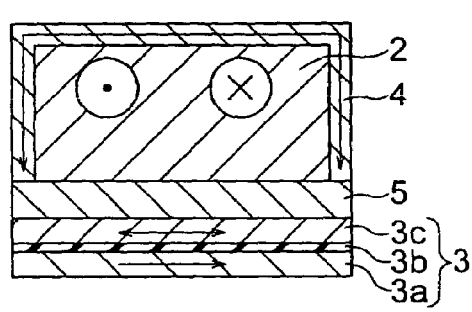
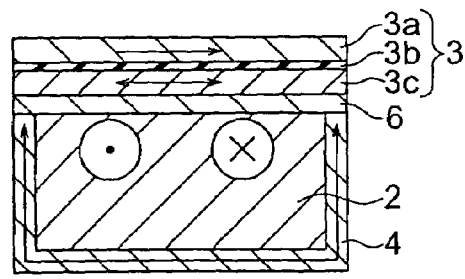
FIG. 2A  FIG. 2B

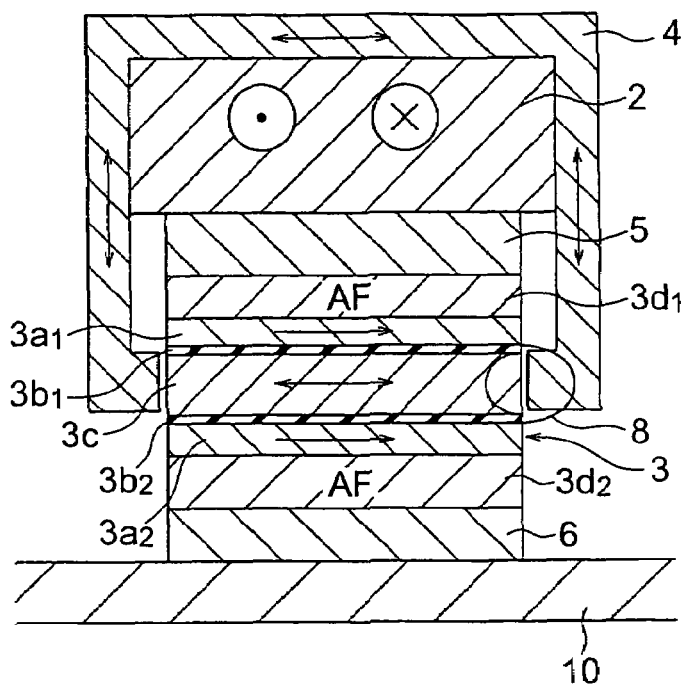
FIG. 6
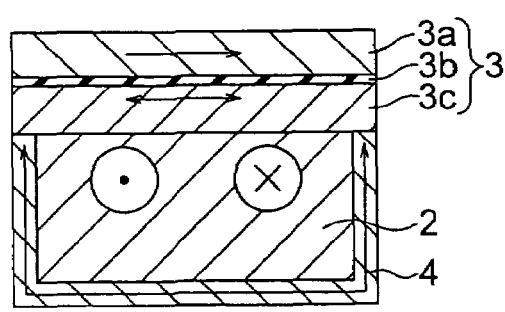    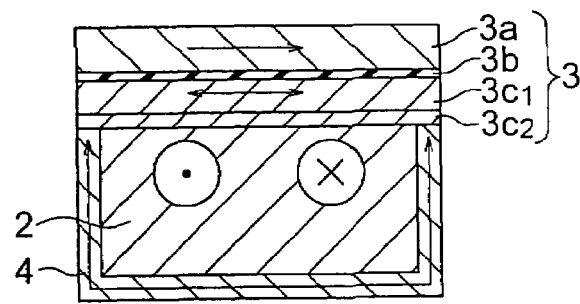
FIG. 7A                FIG. 7B

A-A SECTION

A-A SECTION

A-A SECTION

A-A SECTION

A-A SECTION

A-A SECTION

A-A SECTION

A-A SECTION

MAGNETO-RESISTANCE EFFECT ELEMENT AND MAGNETIC MEMORY

CROSS-REFERENCE TO RELATED APPLICATIONS

This application is based upon and claims the benefit of priority from prior Japanese Patent Application No. 2002-318965, filed on Oct. 31, 2002 in Japan, the entire contents of which are incorporated herein by reference.

1. Field of the Invention

The present invention relates to a magneto-resistance effect element and a magnetic memory 2. Related Art A magnetic random access memory (hereinafter, also called "MRAM") is a memory device where a magneto-resistance effect element with magneto-resistance effect is used in a memory cell portion where information or data is stored, and it has been noticed as the next generation memory device characterized by a high speed operation, a mass volume and a non-volatile. The magneto-resistance effect means a phenomenon that, when magnetic field is applied to a ferromagnetic material, an electric resistance varies according to a magnetization direction of the ferromagnetic material. Operation as a memory device can be achieved by using the magnetization direction of the ferromagnetic material for recording information and reading the information according to magnitude of electric resistance corresponding to the magnetization direction.

In recent years, in a ferromagnetic tunneling junction including a sandwiching structure where an insulating layer called "tunnel barrier layer" is inserted between two ferromagnetic layers, a magneto-resistance change ratio (MR ratio) of 20% or more has been attained due to a tunnel magneto-resistance effect (hereinafter, referred to as "TMR effect"), and a MRAM using a ferromagnetic tunnel junction magneto-resistance effect element (hereinafter, also, referred to as "TMR element") utilizing the magneto-resistance effect has been expected and noticed.

In case that the TMR element is used in a memory cell of the MRAM, one ferromagnetic layer of two ferromagnetic layers sandwiching a tunnel barrier layer is formed as a magnetization fixed layer (also, called "reference layer") where the magnetization direction is fixed so as not to change, while the other ferromagnetic layer is formed as a magnetization free layer (also, called "a storage layer") where the magnetization direction is inverted in response to an external magnetic field. By causing a parallel state where the magnetization directions of the reference layer and the storage layer are parallel and an anti-parallel state where they are anti-parallel to correspond to "0" and "1" of binary information, respectively, information can be stored. Writing of recorded information is conducted by reversing the magnetization direction of the storage layer by an induced magnetic field generated by causing current to flow in a writing wire provided in the vicinity of the TMR element.

Further, reading-out of recorded information is conducted by detecting a resistance change amount due to the TMR effect. Therefore, it is preferable for the storage layer that the resistance change ratio (MR ratio) due to the TMR effect is large and a magnetic field required for magnetization inversion, namely a switching magnetic field is small.

On the other hand, it is necessary to fix the magnetization direction of the reference layer so as to be difficult to inverse, and method or means where an anti-ferromagnetic layer is provided so as to contact with the ferromagnetic layer and occurrence of magnetization inversion is made difficult by a switching coupling force is employed and such a structure is called "spin valve type structure". In this structure, the magnetization direction of the reference layer is determined by annealing while applying a magnetic field (magnetization fixing anneal).

As described above and as shown in FIG. 21A, since an induced magnetic field due to a current caused to flow in a writing wire 80 is used for magnetization inversion of a storage layer 3c in a TMR element 3, there occurs a problem that when a switching magnetic field of the storage layer 3c is large, current to be flown in the writing wire becomes large so that power consumption becomes large. In order to solve this problem, as shown in FIG. 21B, a wire with a yoke where the writing wire 80 is covered with soft magnetic material 82 so that an induced magnetic field generated from the writing wire 80 is strengthened in the vicinity of the TMR element 3 has been proposed. Incidentally, in FIGS. 21A and 21B, the TMR element 3 is constituted with a reference layer 3a, a tunnel barrier layer 3b and a storage layer 3c.

An MRAM where a thin film (yoke) comprising high magnetic permeability material is provided around a writing wire has been proposed (for example, refer to U.S. Pat. No. 5,659,499 and Japanese Patent Laid-Open Pub. No.2002-110938).

By employing the structure where the writing wire is covered with the yoke in this manner, it is made possible to generate a magnetic field several times stronger than the conventional one. However, there occurs a problem that a storing state of the storage layer in the TMR element becomes unstable due to the remnant magnetization generated by the added yoke or the like.

SUMMARY OF THE INVENTION

The present invention has been made in view of the above circumstances, and an object thereof is to provide a magnetic memory whose storing state is stable.

A magnetic memory according to a first aspect of the present invention includes a plurality of memory cells, each memory cell includes: at least one writing wire; at least one data storage portion, provided on at least one portion of an outer periphery of the writing wire, which comprises a ferromagnetic material whose magnetization direction can be inverted by causing a current to flow in the writing wire; and at least one magneto-resistance effect element, disposed in the vicinity of the data storage portion, which senses the magnetization direction of the data storage portion.

Incidentally, such a constitution can be employed that a plurality of common bit lines and a cell bit line branched from each common bit line for each memory cell are provided, the data storage portion is provided at at least one portion of an outer periphery of the cell bit line, the magneto-resistance effect element is provided in the vicinity of the data storage portion, and the cell bit line functions as the writing wire.

Incidentally, the bit line described herein means a signal line through which information or data of "0" or "1" is transmitted at a time of data writing or data reading, and when the bit line functions as the writing wire, the information can be caused to correspond to "0" or "1" by changing the direction of current flowing in the bit line.

A magnetic element according to a second aspect of the present invention includes: a writing wire and a magneto-resistance effect element, the magneto-resistance effect element including at least one magnetization free layer which covers an outer periphery of the writing wire and comprises a ferromagnetic material whose magnetization direction can be inverted by causing a current to flow in the writing wire; and a stack film, the stack film including a magnetization fixed layer; a tunnel barrier layer sandwiched between the magnetization free layer and the magnetization fixed layer; and an anti-ferromagnetic layer provided on one side of the magnetization fixed layer opposite from the tunnel barrier layer.

A magnetic element according to a third aspect of the present invention includes: a writing wire and a magneto-resistance effect element, the magneto-resistance effect element including at least one magnetization free layer which covers an outer periphery of the writing wire and comprises a ferromagnetic material whose magnetization direction can be inverted by causing a current to flow in the writing wire; and a first and second stack films, the first stack film including a first magnetization fixed layer provided on one side of the writing wire via the magnetization free layer; a first tunnel barrier layer provided between the magnetization free layer and the first magnetization fixed layer; and a first anti-ferromagnetic layer provided on one side of the first magnetization fixed layer opposite from the first tunnel barrier layer, the second stack film comprising a second magnetization fixed layer provided on the other side of the writing wire via the magnetization free layer; a second tunnel barrier layer provided between the magnetization free layer and the second magnetization fixed layer; and a second anti-ferromagnetic layer provided on one side of the second magnetization fixed layer opposite from the second tunnel barrier layer.

A magnetic memory according to a fourth aspect of the present invention includes: a plurality of memory cells, each memory cell having the above-mentioned magnetic element.

BRIEF DESCRIPTION OF THE DRAWINGS

FIGS. 1A and 1B are sectional views showing a basic constitution and operation of a memory cell used in a magnetic memory according to each embodiment of the present invention;

FIGS. 2A and 2B are sectional views showing constitutions of other memory cells used in a magnetic memory according to each embodiment of the present invention;

FIG. 6 is a sectional view showing a constitution of a memory cell of a magnetic memory according to one embodiment of the present invention using the double junction type TMR element;

FIGS. 7A and 7B are sectional views showing constitutions of memory cells of a magnetic memory according to one embodiment of the present invention, where a magnetic sensor and a data storage portion are arranged so as to contact with each other;

EMBODIMENTS OF THE INVENTION

Figure 3:
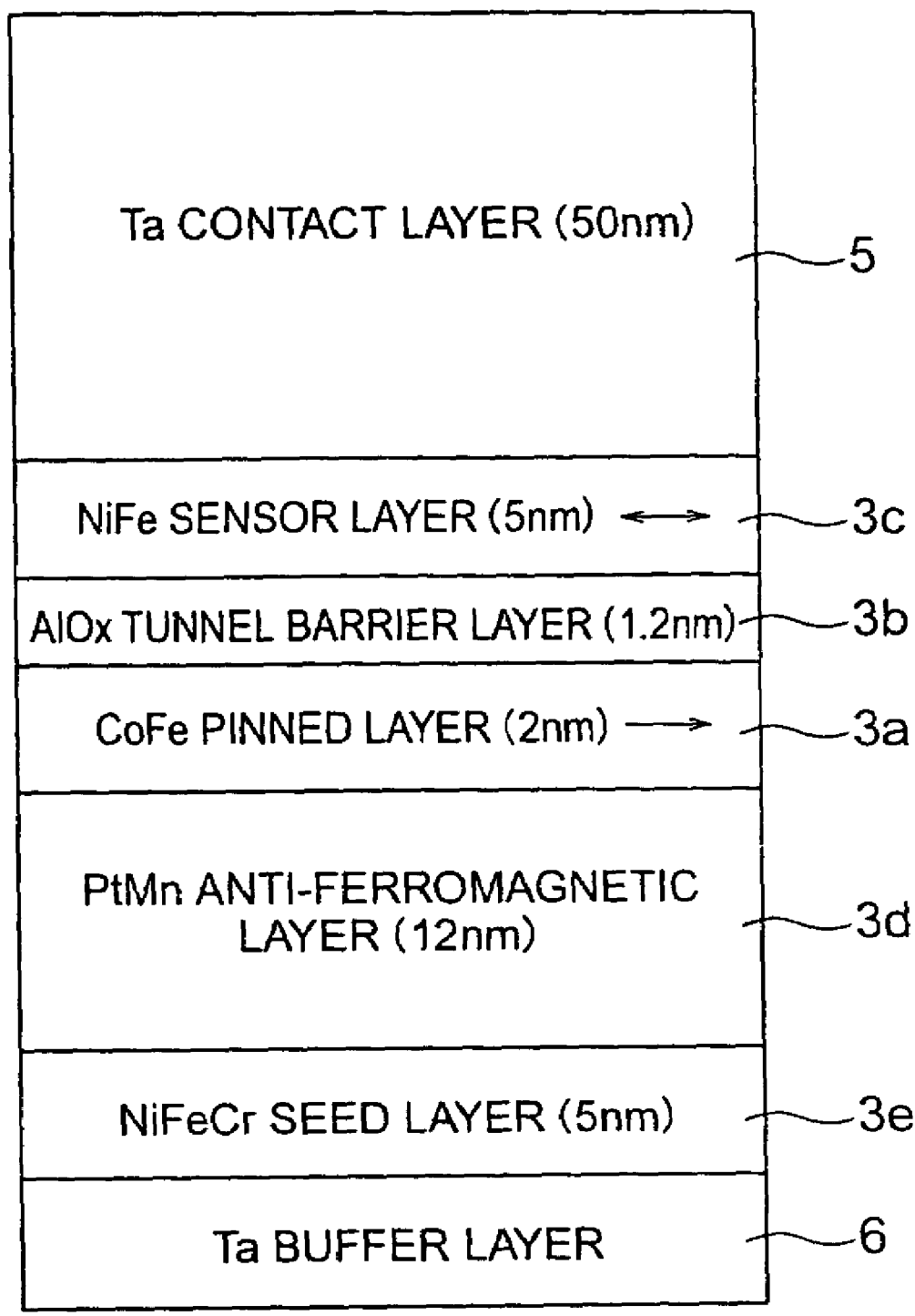
FIG. 3 is a sectional view showing a constitution of a TMR element of a bottom pin type.

Prior to explanation of magnetic memories according to embodiments of the present invention, a basic constitution and an operation principle of a memory cell used in a magnetic memory according to each embodiment will be explained with reference to FIGS. 1A and 1B.

A magnetic memory according to each embodiment has a plurality of memory cells. As shown in FIGS. 1A and 1B, each memory cell is provided with a data storage portion 4 comprising a cell bit line 2 serving as a writing wire and ferromagnetic material covering one portion of an outer periphery of the cell bit line 2 and magnetized in a circumferential direction of the cell bit line 2, and a magnetic sensor 3 which detects the magnetization direction of the data storage portion 4 provided in the vicinity of the data storage portion 4. The cell bit line 2 is formed so as to be branched from a common bit line BL described later.

The magnetization of the data storage portion 4 is inverted by a magnetic field induced by a current flowing in the cell bit line 2. That is, the magnetization direction of the data storage portion 4 is determined by the direction of a current caused to flow in the cell bit line 2. Even if a current caused to flow in the cell bit line 2 is made zero, the magnetization in a circumferential direction of the cell bit line 2 remains in the data storage portion 4. The magnetization direction remaining in the data storage portion 4 is caused to correspond to binary information "0" or "1". For example, the direction of the remnant magnetization shown in FIG. 1A is caused to correspond to "0" of the binary information, while the direction of the remnant magnetization shown in FIG. 1B is caused to correspond to "1" thereof. With such correspondences, data corresponding to the direction of a current flowing in the cell bit line 2 is written in the data storage portion 4. Then, by reading the direction of magnetization remaining in the data storage portion 4 by using the magnetic sensor 3 provided in the vicinity of the data storage portion, the data stored in the data storage portion 4 can be read out.

Used as the magnetic sensor 3 is a ferromagnetic tunnel junction type magneto-resistance effect element (hereinafter, also referred to as "TMR element"), for example. The TMR element 3 is provided with a magnetization fixed layer 3a where magnetization has been fixed, a tunnel barrier layer 3b and a magnetization free layer 3c. The magnetization free layer 3c has a magnetization direction corresponding to the direction of magnetization of the data storage portion 4. Since the resistance of the TMR element 3 varies according to the magnetization directions of the magnetization fixed layer 3a and the magnetization free layer 3c, the magnetization direction of the data storage portion 4, namely data stored in the data storage portion 4 can be sensed by this TMR element 3. At that time, the magnetization easy axis direction of the magnetization free layer 3c and the magnetization easy axis direction of the data storage portion 4 may be parallel to each other or they may not be parallel to each other.

Incidentally, as described later, a writing selection transistor for individual writing is provided in each memory cell.

In the magnetic memory having such a memory cell, since a magnetic field generated from the cell bit line 2 acts on the data storage portion 4 effectively, a switching current is small. Further, a writing wire for writing data in the data storage portion 4 of the memory cell is only the cell bit line 2. For this reason, power consumption can be reduced as compared with a conventional magnetic memory where it is necessary to cause writing currents to flow in both of a bit line and a word line. Furthermore, since individual writing is allowed for each memory cell, influence of variations of switching characteristics can be reduced. Further, since the volume of the data storage portion 4 can be made large and anisotropy in shape can also be made large, data retaining state is stabilized.

Next, a constitution of a memory cell used in a magnetic memory according to each embodiment of the present invention will be explained with reference to FIG. 2A to FIG. 8. As the memory cell, there are ones of two kinds of a bottom sensor type where the magnetic sensor 3 is provided on a lower side of the data storage portion 4, as shown in FIG. 2A, and of a top sensor type where the magnetic sensor 3 is provided on an upper side of the data storage portion 4, as shown in FIG. 2B. In either of the memory cells of the bottom sensor type and the top sensor type, the data storage portion 4 covers three side surfaces of the wiring wire 2 and the magnetic sensor 3 comprising, for example, a TMR element is provided on the remaining one side surface thereof.

In each embodiment of the present invention, material used for the data storage portion 4 is ferromagnetic material including at least one of Co, Ni and Fe, and it is preferable that the material has a large magnetic permeability and a large remnant magnetization. More specifically, the ferromagnetic material comprises at least one element selected from Ni—Fe alloy, Co—Fe—Ni alloy, amorphous magnetic material or a fine crystalline ferromagnetic material expressed by the following chemical formulae; Co—Fe-AA, Co—Fe-AA-AA2, Fe-AA-AA2, Co-AA-AA2, Co—Mn-AA-AA2, Fe—Cu-AA-AA2, Co—Fe—Ni-AA. Here, AA and AA2 represent B, Si, Ge, Zr, Nb, P, Mo, Ta, N, C, Cr, Ti, Al, W, V or rare earth metal element.

There are three cases that the bottom pin type TMR element is used as the magnetic sensor 3, that the top pin type TMR element is used as the same, and that a double junction type TMR element having a double tunnel junction is used as the same. Even in either case, the writing wire 2 and the magneto-resistance effect element 3 are electrically connected to each other so that the writing wire 2 serves as the bit line at a time of reading.

In the bottom pin type TMR element, as shown in FIG. 2A, a magnetization fixed layer (also, called "pinned layer) 3a is formed on its bottom, a tunnel barrier layer 3b is formed on the magnetization fixed layer 3a, a magnetization free layer (also, called "sensor layer") 3c is formed on the tunnel barrier layer 3b, a contact layer 5 is formed on the magnetization free layer 3c, and a cell bit line 2 serving as a writing wire is formed on the contact layer 5. Three faces of the cell bit line 2 other than a face thereof coming in contact with the contact layer 5 are covered with the data storage portion 4.

The top pin type TMR element, as shown in FIG. 2B, has a constitution that a data storage portion 4 is formed so as to cover a bottom face and side faces of a cell bit line 2, a buffer layer 6 is formed on an upper face of the cell bit line 2, a magnetization free layer (sensor layer) 3c is formed on the buffer layer 6, a tunnel barrier layer 3b is formed on the magnetization free layer 3c, and a magnetization fixed layer (pinned layer) 3a is formed on the tunnel barrier layer 3b.

In the bottom sensor type memory cell, the bottom pin type TMR element where the sensor layer 3c is positioned near the data storage portion 4 is desirable. In the top sensor type memory cell, the top pin type TMR element where the sensor layer 3c is positioned near the data storage portion 4 is desirable. Even if the double junction type TMR element is used in either one of the bottom sensor type memory cell and the top sensor type memory cell, sensitivity is somewhat inferior but a large output can be achieved.

One specific example of the bottom pin type TMR element is shown in FIG. 3. A bottom pin type TMR element shown in FIG. 3 has a constitution that a buffer layer 6 comprising Ta, a seed layer 3e with a film thickness of 5 nm comprising NiFeCr, an anti-ferromagnetic layer 3d with a film thickness of 12 nm comprising PtMn, a magnetization fixed layer (pinned layer) 3a with a film thickness of 2 nm comprising CoFe, a tunnel barrier layer 3b with a film thickness of 1.2 nm comprising AlOx, a magnetization free layer (sensor layer) 3c with a film thickness of 5 nm comprising NiFe and a contact layer 5 with a film thickness of 50 nm comprising Ta have been sequentially formed.

Figure 4:
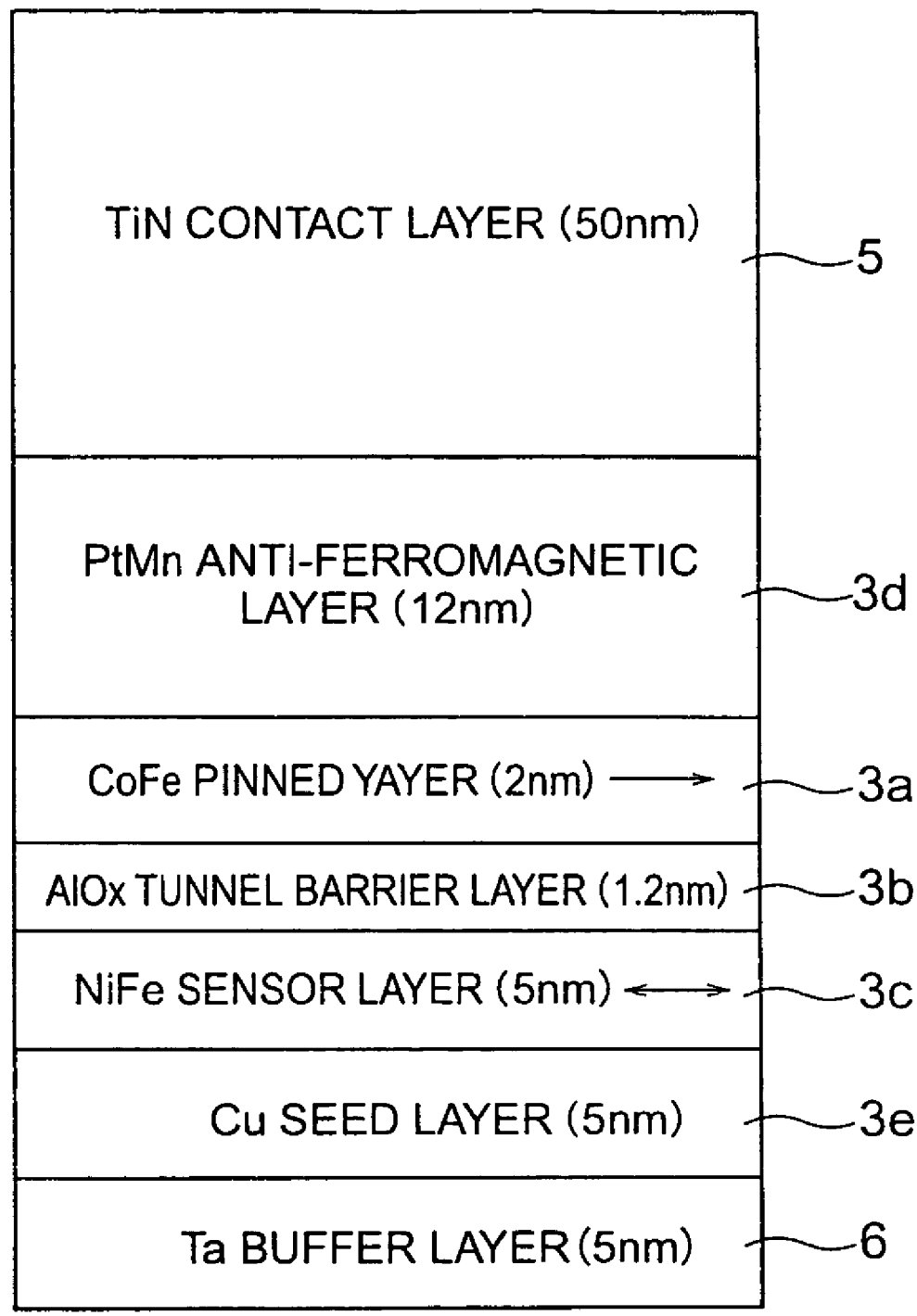
FIG. 4 is a sectional view showing a constitution of a TMR element of a top pin type.

One specific example of the top pin type TMR element is shown in FIG. 4. A top pin type TMR element shown in FIG. 4 has a constitution that a buffer layer 6 comprising Ta, a seed layer 3e with a film thickness of 5 nm comprising Cu, a magnetization free layer (sensor layer) 3c with a film thickness of 5 nm comprising NiFe, a tunnel barrier layer 3b with a film thickness of 1.2 nm comprising AlOx, a magnetization fixed layer (pinned layer) 3a with a film thickness of 2 nm comprising CoFe, an anti-ferromagnetic layer 3d with a film thickness of 12 nm comprising PtMn and a contact layer 5 with a film thickness of 50 nm comprising Ta have been sequentially formed.

Figure 5:
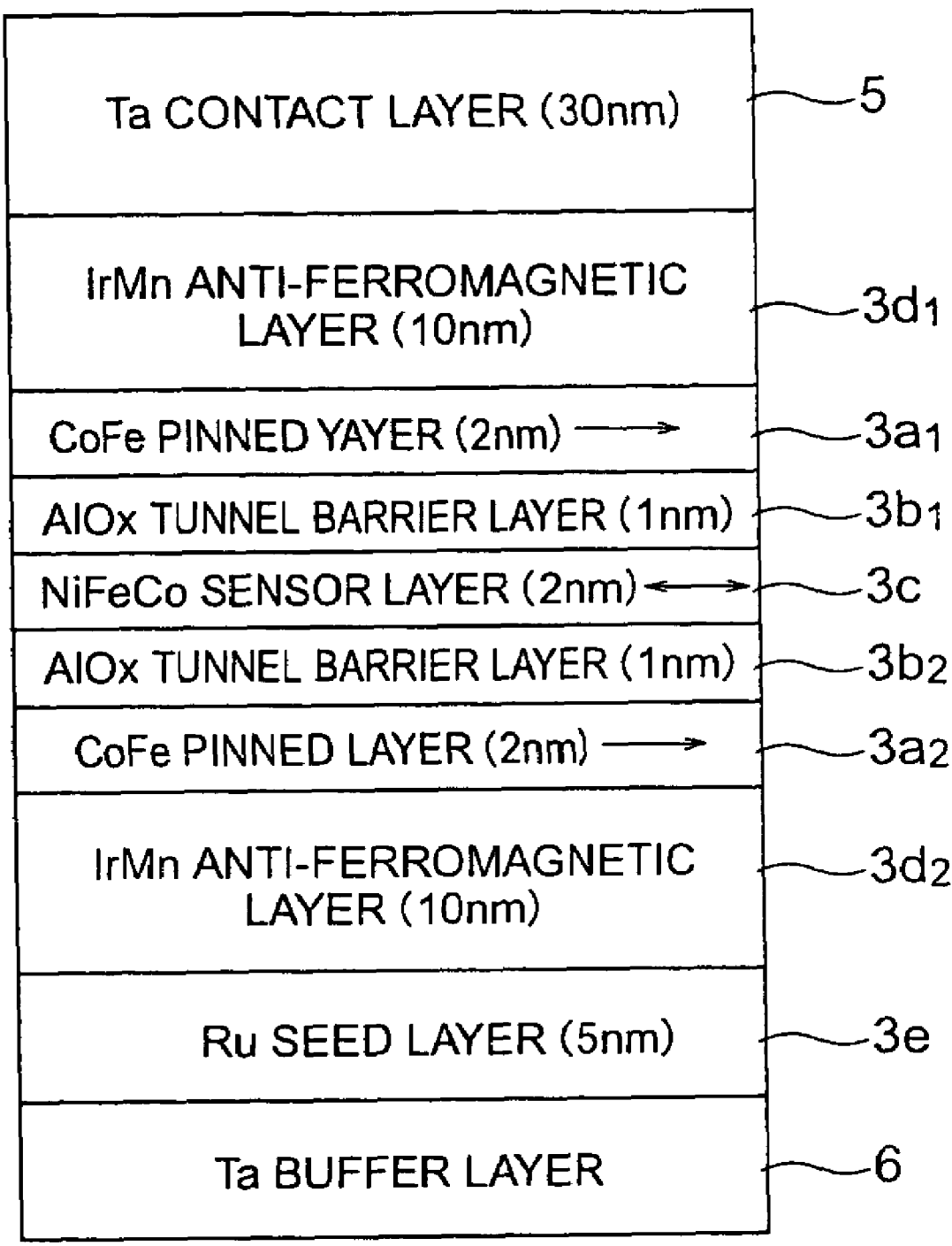
FIG. 5 is a sectional view showing a constitution of a double junction type TMR element.

One specific example of the double junction type TMR element is shown in FIG. 5. A double junction type TMR element shown in FIG. 5 has a constitution that a buffer layer 6 comprising Ta, a seed layer 3e with a film thickness of 5 nm comprising Ru, an anti-ferromagnetic layer $3d_2$ with a film thickness of 10 nm comprising IrMn, a magnetization fixed layer (pinned layer) $3a_2$ with a film thickness of 2 nm comprising CoFe, a tunnel barrier layer $3b_2$ with a film thickness of 1 nm comprising AlOx, a magnetization free layer (sensor layer) $3c$ with a film thickness of 2 nm comprising NiFeCo, a tunnel barrier layer $3b_1$ with a film thickness of 1 nm comprising AlOx, a magnetization fixed layer (pinned layer) $3a_1$ with a film thickness of 2 nm comprising CoFe, an anti-ferromagnetic layer $3d_1$ with a film thickness of 10 nm comprising IrMn and a contact layer 5 with a film thickness of 30 nm comprising Ta have been sequentially formed.

Incidentally, in each embodiment of the present invention, a material used for the sensor layer $3c$ is a ferromagnetic material including at least one of Co, Ni and Fe, and it is preferable that the material has a large magnetic permeability. More specifically, the material comprises at least one element selected from the group consisting of Ni—Fe alloy, Co—Fe—Ni alloy, amorphous magnetic material or a fine crystalline ferromagnetic material expressed by the following chemical formulae: Co—Fe-AA, Co—Fe-AA-AA2, Fe-AA-AA2, Co-AA-AA2, Co—Mn-AA-AA2, Fe—Cu-AA-AA2, Co—Fe—Ni-AA. Here, AA and AA2 represent B, Si, Ge, Zr, Nb, P, Mo, Ta, N, C, Cr, Ti, Al, W, V or rare earth metal element. Incidentally, the material for the sensor layer $3c$ may be the same as the material for the data storage portion 4. Further, it is preferable that a coercive force of the former is equal to or smaller than that of the latter.

Next, a constitution of a memory cell using a double junction type TMR element is shown in FIG. 6. A memory cell shown in FIG. 6 is formed with a double junction type TMR element where a buffer layer 6, an anti-ferromagnetic layer $3d_2$, a magnetization fixed layer $3a_2$, a tunnel barrier layer $3b_2$, a sensor layer $3c$, a tunnel barrier layer $3b_1$, a magnetization fixed layer $3a_1$, an anti-ferromagnetic layer $3d_1$, and a contact layer 5 have been stacked on a lower portion electrode wire 10. Such a constitution is employed that a cell bit line 2 serving as a writing wire is formed on the contact layer 6 of the double junction type TMR element 3, three faces of the cell bit line 2 other than one face thereof coming in contact with the contact layer 5 is covered with a data storage portion 4, and the data storage portion 4 extends near side portions of the sensor layer $3c$ of the double junction type TMR element 3 such that it is disposed to be close to the sensor layer $3c$. Incidentally, in FIG. 6, the seed layer $3e$ of the double junction type TMR element shown in FIG. 5 is not shown.

In the memory cell shown in FIG. 6, since the data storage portion 4 extends in the vicinity of the side portions of the sensor layer $3c$, it is possible to make the sensor layer $3c$ thick so that sensitivity is improved. Further, by disposing the data storage portion 4 comprising ferromagnetic material to be close to the sensor layer $3c$, namely, making a gap 8 between the sensor layer $3c$ and the data storage layer 4 small, a magnetically coupling between the sensor layer 3 and the data storage portion 4 becomes large, which results in improvement in sensitivity.

Next, examples of a memory cell arranged such that a TMR element 3 and a data storage portion 4 contact with each other will be explained with reference to FIG. 7A and 7B. FIG. 7A shows a top sensor type memory cell, where a top pin type TMR element 3 is used as the TMR element. In FIG. 7A, such a formation is made that a sensor layer $3c$ of the TMR element 3 contact with a cell bit line 2 serving as the writing wire and it also contacts with a data storage portion 4 covering the cell bit line 2. A magnetization fixed layer (pinned layer) $3a$ is formed on the sensor layer $3c$ via a tunnel barrier layer $3b$. Incidentally, as shown in FIG. 7B, the sensor layer 3 may have a stacked structure that two or more ferromagnetic material layers have been stacked, for example, a layer $3c_1$ and a layer $3c_2$ each comprising ferromagnetic material have been stacked.

In this stacked structure, when the sensor layer $3c$ or the sensor layer $3c_2$ is made from the same material as that of the data storage portion 4, such a structure or arrangement appears as if the data storage portion surrounds the wire 2, and this structure is called "a closure type storage portion". In such a structure that the sensor layer $3c$ and the writing wire 2 comes in direct contact with each other, since a magnetic field generated from the writing wire 2 hardly leaks outside, data writing with a small current is made possible.

The memory cells shown in FIGS. 7A and 7B are cell memories of the top sensor type, but they may be of the bottom sensor type where the memory cells shown in FIG. 7A and 7B have been turned 180° upside down. In the bottom sensor type memory cells, a bottom pin type TMR element is used as the TMR element.

Figure 8:
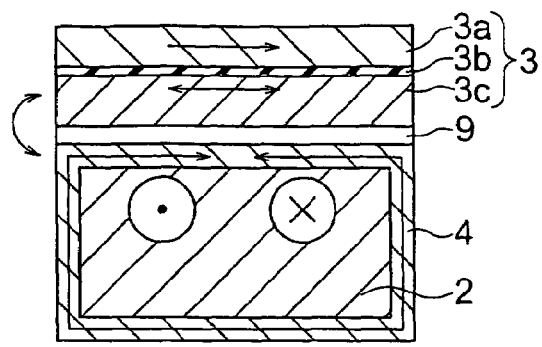
FIG. 8 is a sectional view showing a constitution of a memory cell of a magnetic memory according to one embodiment of the present invention, where a magnetic sensor and a data storage portion are magnetically coupled to each other.

Next, a constitution of a memory cell where a magnetic sensor 3 and a data storage portion 4 are not directly connected to each other but they are magnetically coupled to each other is shown in FIG. 8. FIG. 8 shows a memory cell of a top sensor type, where a top pin type TMR element 3 is used as the TMR element. In FIG. 8, four faces of a cell bit line 2 serving as the writing wire is covered with a data storage portion 4 to constitute the closure type storage portion, a sensor layer $3c$ of the TMR element 3 is formed on the data storage portion 4 via a non-magnetic layer 9, a tunnel barrier layer $3b$ is formed on the sensor layer $3c$, and a magnetization fixed layer (pinned layer) $3a$ is formed on the tunnel barrier layer $3b$. The sensor layer $3c$ and the data storage portion 4 are magnetically coupled via the non-magnetic layer 9. The magnetic coupling may be a ferromagnetic coupling or an anti-ferromagnetic coupling. Further, the non-magnetic layer 9 may be a metal material or an insulating layer.

In case that the metal material is used as the non-magnetic layer 9, it is preferable to use a material causing an inter-layer magnetic coupling such as Ru, Cu, Au, Ag, Ir, Cr, Re, Nb, Pd, Pt or the like. In case that the insulating film is used as the non-magnetic layer 9, the layer has a thickness of about 0.3 nm to 5 nm and serves as a tunnel barrier, and it causes a Neel's coupling due to undulation on an interface thereof.

In such a memory cell where the sensor layer $3c$ and the writing wire 2 have been magnetically coupled, since a magnetic field generated from the writing wire 2 hardly leaks outside, it is made possible to conduct data writing with a small current.

Incidentally, the memory cell shown in FIG. 8 is the memory cell of the top sensor type, but it may be of the bottom sensor type where the memory cell shown in FIG. 8 have been turned 180° upside down. In the bottom sensor type memory cell, a bottom pin type TMR element is used as the TMR element.

First Embodiment

Figure 9A:
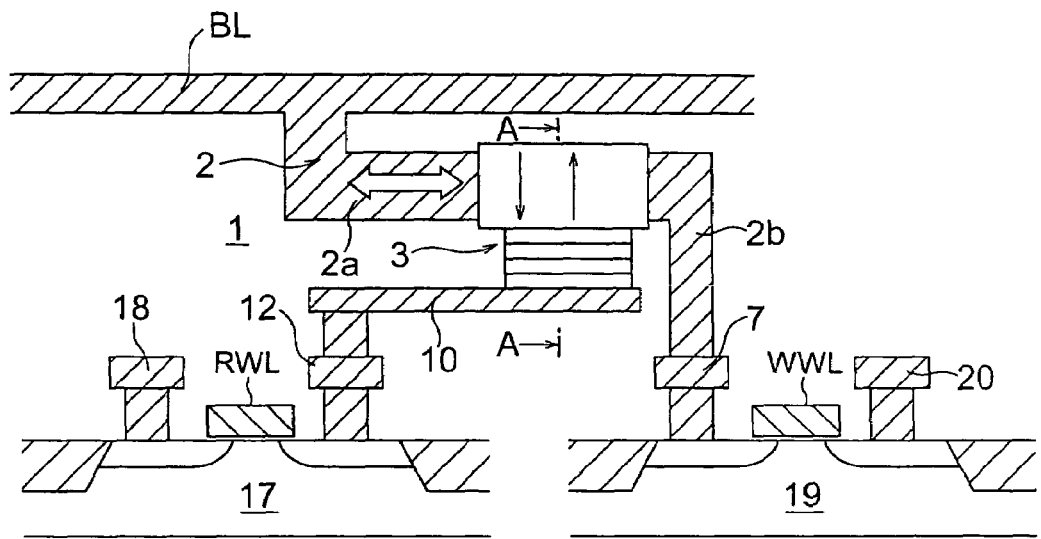
FIGS. 9A and 9B are sectional views showing constitutions of a memory cell of a magnetic memory according to a first embodiment of the present invention.
Figure 9B:
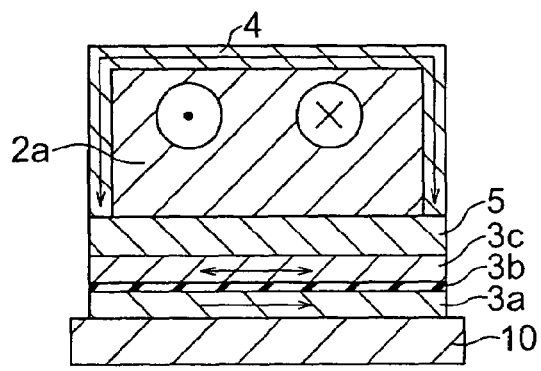
Figure 10:
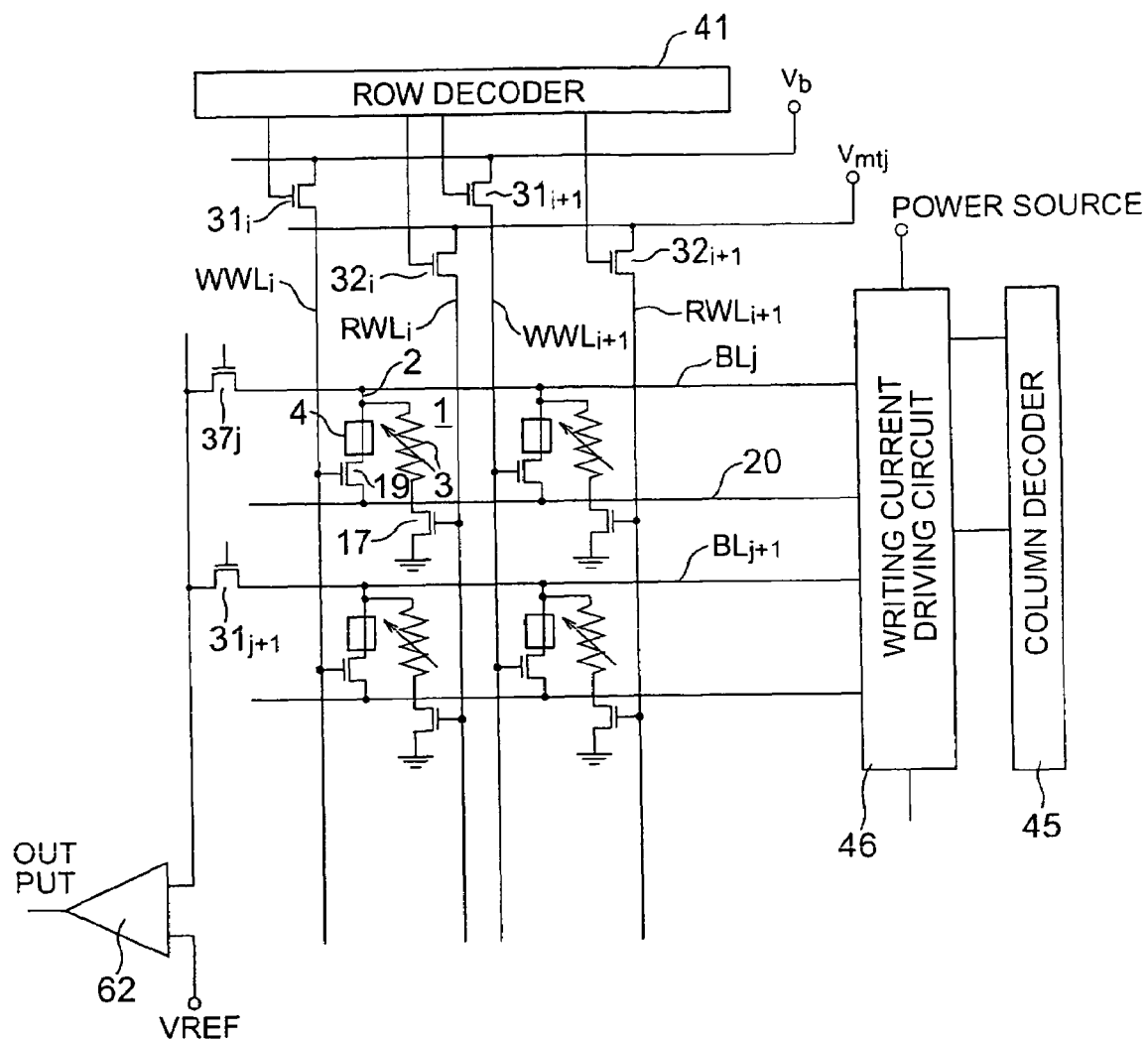
FIG. 10 is a wiring diagram showing a constitution of a memory cell array of a magnetic memory according to the first embodiment.

Next, a constitution of a magnetic memory according to a first embodiment will be explained with reference to FIG. 9A to FIG. 11. A magnetic memory according to the first embodiment has a plurality of memory cells. FIG. 9A is a sectional view showing a constitution of each memory cell, and FIG. 9B is a sectional view of the memory cell shown in FIG. 9A, taken along line A—A. Further, FIG. 10 is a diagram showing a constitution of a memory cell array of the magnetic memory according to the first embodiment.

As shown in FIGS. 9A and 9B, each memory cell 1 is provided with a cell bit line 2 serving as a writing wire, a magnetic sensor 3 comprising a TMR element, a data storage portion 4, a reading selection transistor 17 and a writing selection transistor 19.

The cell bit line 2 has a first wiring portion 2a branched from a common bit line BL to be electrically connected to a TMR element 3 and a second wiring portion 2b connected to the first wiring portion 2a and connected to one of a source and a drain of a writing selection transistor 19 via a connection plug 7. The first wiring portion 2a has a portion substantially parallel with the common bit line BL. The second wiring portion 2b is provided along a side portion of the TMR element 3 via an insulating film (not shown).

The TMR element 3 is provided with a sensor layer 3c electrically connected to the first wiring portion 2a of the cell bit line 2 via the contact layer 5, a tunnel barrier layer 3b contacted with the sensor layer 3c, and a magnetic fixing layer 3a coming in contact with the tunnel barrier layer 3b. The magnetization fixed layer 3a is connected to one of a source and a drain of a reading selection transistor 17 via a lead electrode 10 and a connection plug 12. Incidentally, in FIGS. 9A and 9B, the TMR element 3 has been provided at a position different from the position of the connection plug 12, but it may be provided just above the connection plug 12.

The data storage portion 4 is formed so as to cover three faces of the first wiring portion 2a other than a face thereof coming in contact with the TMR element 3.

The reading selection transistor 17 is connected, at the other of the source and the drain thereof, to a ground power source via a connection plug 18, and the gate thereof also serves as a reading selection word line RWL. Further, the writing selection transistor 19 is connected, at the other of the source and the drain thereof, to a common source line 20 used at a time of flowing of a writing current, and the gate thereof also serves as a writing selection word line WWL.

Next, a writing operation and a reading operation of the magnetic memory according to this embodiment will be explained with reference to FIG. 10. Such a case is taken in consideration that a memory cell 1 which belongs to an i (i=1, ... )-th row and is connected to a writing selection word line $WWL_i$ and a reading selection word line $RWL_i$ and which belongs to a j (j=1, ... )-th column and is connected to a common bit line $BL_j$ has been selected. A case that bit data is written in the selected memory cell 1 will be explained. An address for selecting the memory cell 1 which belongs to the i-th row and the j-th column is inputted to a row decoder 41 and a column decoder 45. A row selection transistor $31_i$ is turned ON by the row decoder 41 so that the writing selection word line $WWL_i$ is selected and a writing current driving circuit 46 is controlled by the column decoder 45 so that the common bit line $BL_j$ is selected, and a writing current flows in the common bit line $BL_j$. At this time, a column selection transistor $37_j$ is not selected and is in OFF state. Further, a row selection transistor $32_i$ is also in an OFF state. A potential or voltage Vb is applied on the gate of the writing selection transistor 19 by turning-ON of the row selection transistor $31_i$ so that the writing selection transistor 19 is turned ON. A writing current flows from the common bit line $BL_j$ to the cell bit line 2 of the selected memory cell 1. At this time, since writing selection transistors 19 of the other memory cells which are connected to the common bit line $BL_j$ but are not selected are put in OFF state, no writing current flows in the cell bit lines 2 of the other memory cells which have not been selected. The magnetization of the data storage portion 4 is inverted by a current magnetic field induced by a writing current flowing in the cell bit line 2 of the selected memory cell 1, so that data is written.

Figure 11:
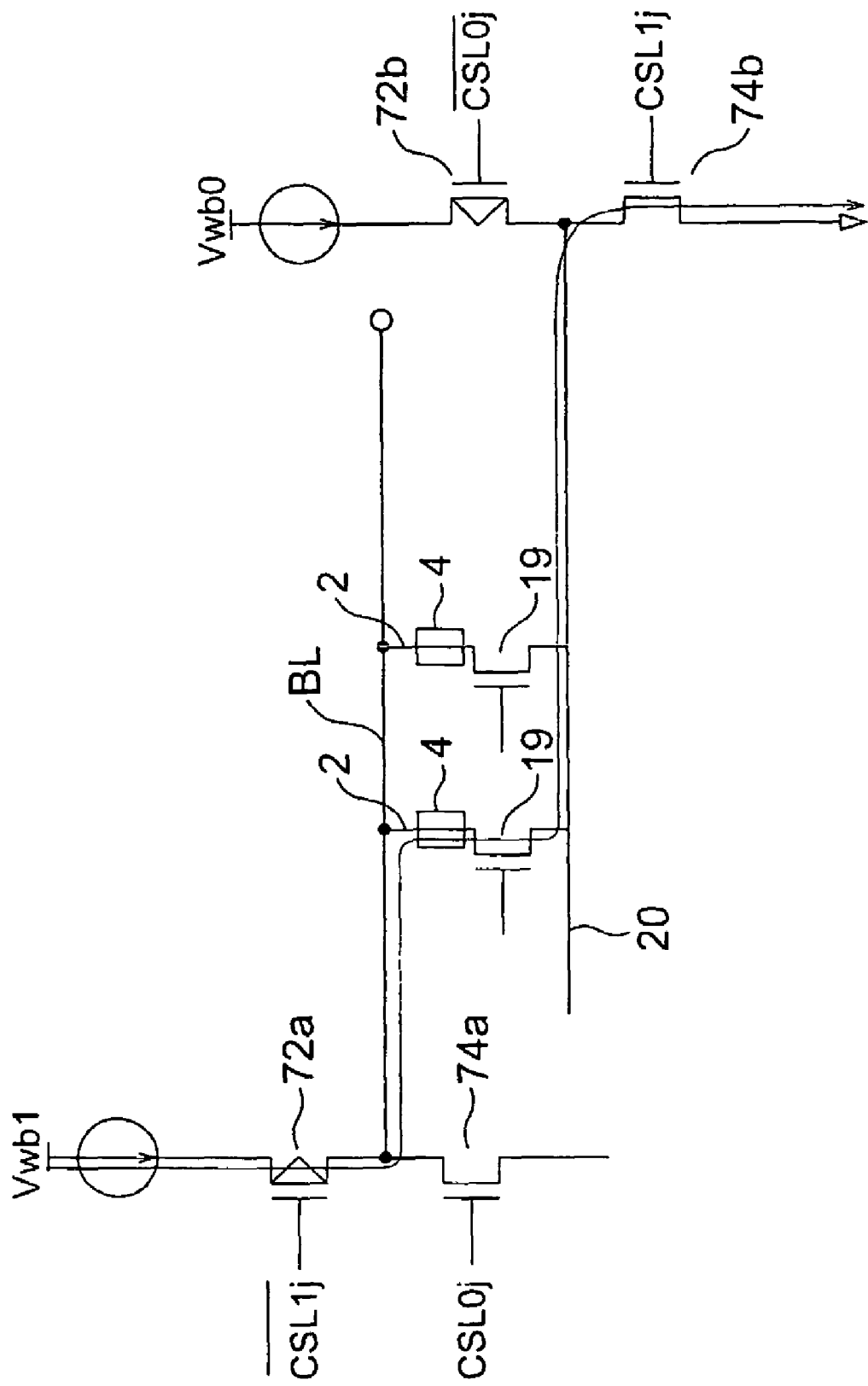
FIG. 11 is a diagram for explaining a constitution of one specific example of a writing current driving circuit.

Next, how to cause a writing current to flow will be explained. In this embodiment, a writing current is caused to flow so as to branch from the common bit line BL to the cell bit line 2. A schematic configuration of the writing current driving circuit 46 for allowing the writing current to flow will be shown in FIG. 11. In FIG. 11, two sets of drivers 72a, 72b and signers 74a, 74b are provided. Currents in two directions flow in the writing selection transistor 19 of each memory cell. A current direction varies due to whether the potential of the common source line 20 is made "L" level (for example, OV) or "H" level (for example, 1.5V). For example, when data "1" is written in the data storage portion 4 in the memory cell 1 which belongs to the j (=1, ... )-th column, the potential of a column selection signal $CSL1_j$ is set to "H" level and the potential of a column selection signal $CSL0_j$ is set to "L" level. Thereby, since the driver 72a and the sinker 74b are turned ON and the driver 72b and the sinker 74a are turned to OFF state, a writing current flows from a current source Vwb1 in the driver 72a, the common bit line BL, the cell bit line 2, the writing selection transistor 19, the common source line 20, and the sinker 74b. When data "0" is written in the memory cell 1 which belongs to the j (=1, ... )-th column, the potential of a column selection signal $CSL0_j$ is set to "H" level and the potential of a column selection signal $CSL1_j$ is set to "L" level. Thereby, since the driver 72b and the sinker 74a are turned ON and the driver 72a and the sinker 74b are turned to OFF state, a writing current flows from a current source Vwb0 in the driver 72b, the common source line 20, the writing selection transistor 19, the cell bit line 2, the common bit line BL, and the sinker 74a. Therefore, in the case that data "1" is written and the case that data "0" is written, directions of currents flowing in the cell bit line 2 are opposed to each other.

Incidentally, in order to allow a writing current to flow, it is in substantially necessary to provide two driver-sinker pairs. In this embodiment, however, as shown in FIG. 10, since the common source line 20 is connected to the writing current driving circuit 46 connected to the common bit line BL, it also serves as the driver-sinker pair.

When the writing current is not so large and a voltage difference between both ends of the common bit line BL is not so large, just one N-channel MOSFET enough to be provided as the writing selection transistor 19 in each memory cell 1. When the current is large, a P-channel MOSFET and an N-channel MOSFET are provided in each memory cell in some cases, but it is desirable that one writing selection transistor 19 is provide in each cell in order to realize a high density memory.

Next, referring to FIGS. 2A and 2B again, a case that bit data is read from a selected memory cell will be explained. An address for selecting the memory cell 1 which belongs to the i-th row and the j-th column is inputted into the row decoder 41 and the column decoder 45. Thereby, the row selection transistor $32_i$ is turned ON by the row decoder 41 so that the reading selection word line $RWL_i$ is selected, and the writing current driving circuit 46 is controlled by the column decoder 45 so that a current flows in a common bit line $BL_j$. At this time, the column selection transistor $37_j$ is turned ON by the column decoder 45. Incidentally, the row selection transistor $31_i$ is in ON state. At this time, since the row selection transistor $32_i$ is in ON state, the reading selection transistor 17 of the selected memory cell 1 is also in ON state, so that the above current flows from the common bit line $BL_j$ to cell bit line 2, the TMR element 3, and the reading selection transistor 17. Thereby, the potential of the common bit line $BL_j$ takes a value corresponding to a resistance value of the TMR element 3. This potential is fed to a sense amplifier 62 via a column selection transistor $37_j$ and it is compared with a reference potential VREF, so that data stored in the data storage portion 4 is read out.

As explained above, according to this embodiment, since a magnetic field generated from the cell bit line 2 acts on the data storage portion 4 effectively, a switching current is small. Further, the writing wire for writing data in the data storage portion 4 of the memory cell is only the cell bit line 2. For this reason, as compared with a conventional magnetic memory where it is necessary to cause a writing current to flow in both of a bit line and a word line, reduction of a writing current is made possible and power consumption can be reduced. Furthermore, since individual writing is made possible for each memory cell, influence of variations of switching characteristic can be reduced. In addition, since the volume of the data storage portion 4 can be made large and the shape anisotropy can also be made large, a data holding state is stabilized.

Second Embodiment

Figure 12:
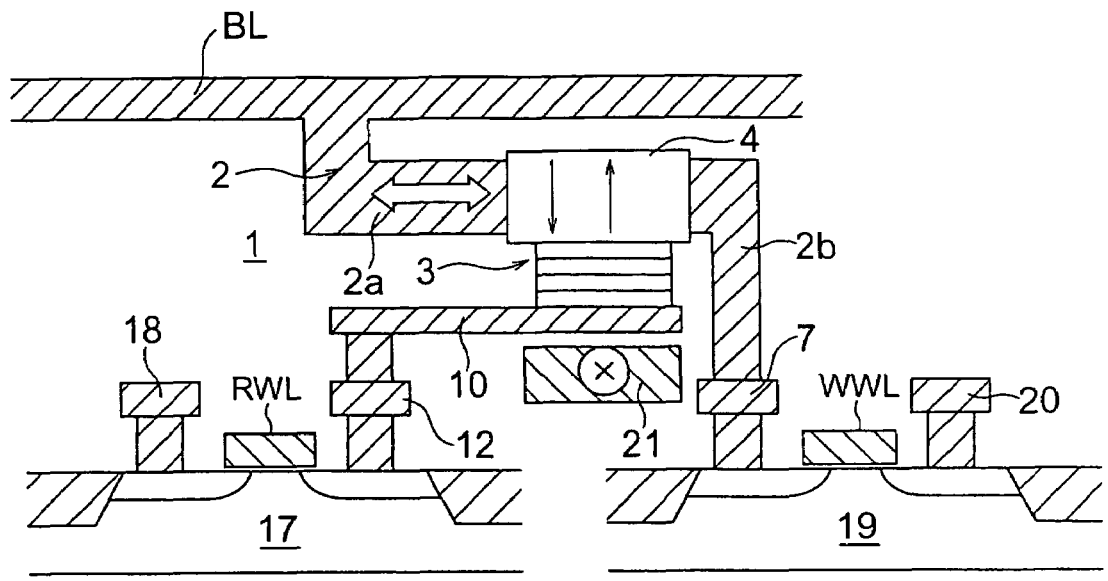
FIG. 12 is a sectional view showing a constitution of a memory cell of a magnetic memory according to a second embodiment of the present invention.

Next, a magnetic memory according to a second embodiment of the present invention will be explained with reference to FIG. 12. FIG. 12 is a sectional view showing a constitution of a memory cell 1 of a magnetic memory according to the second embodiment. The magnetic memory according to the second embodiment has a constitution that a sense assist line 21 is provided below the lead electrode 10 via an insulating film (not shown) in each memory cell 1 of the magnetic memory according to the first embodiment shown in FIGS. 9A and 9B. A current is caused to flow in the sense assist line 21 at a time of data writing to generate a magnetic field in a magnetization hard axis direction of the TMR element 3. By this magnetic field, a switching magnetic field in a magnetization easy axis direction of the sensor layer of the TMR element 3 is made small, so that the sensitivity can be further improved as compared with the case of the first embodiment.

In the second embodiment, also, since individual writing is made possible for each memory cell like the first embodiment, influence of variations of the switching characteristic is reduced. In addition, since the volume of the data storage portion 4 can be made large and the shape anisotropy can also be made large, a data holding state is stabilized.

Third Embodiment

Figure 13:
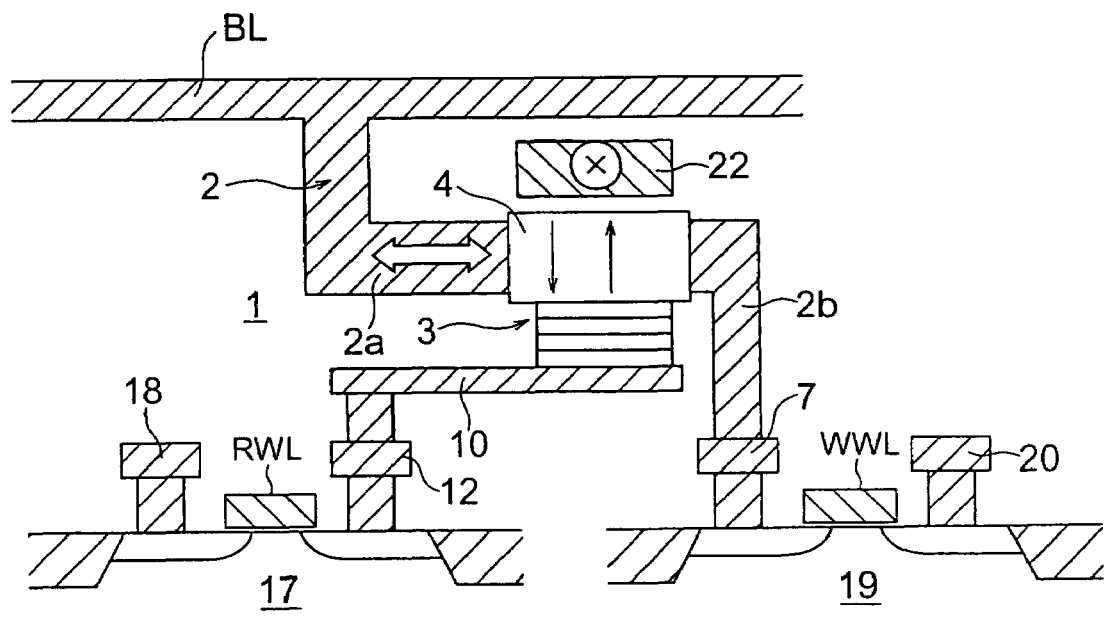
FIG. 13 is a sectional view showing a constitution of a memory cell of a magnetic memory according to a third embodiment of the present invention.

Next, a magnetic memory according to a third embodiment of the present invention will be explained with reference to FIG. 13. FIG. 13 is a sectional view showing a constitution of a memory cell 1 of the magnetic memory according to the third embodiment. The magnetic memory according to the third embodiment has a constitution that a write assist line 22 is provided above the data storage portion 4 via an insulating film (not shown) in each memory cell 1 of the magnetic memory according to the first embodiment shown in FIGS. 9A and 9B. The write assist line 22 is provided to be substantially perpendicular to the first wiring portion 2a of the cell bit line 2.

In the third embodiment thus constituted, a current is caused to flow in the write assist line 22 at a time of data writing to generate a magnetic field in a direction perpendicular to the magnetization direction of the data storage portion 4. By this magnetic field, magnetization inversion of the data storage portion 4 is assisted, so that a writing current caused to flow in the cell bit line 2 can be reduced.

In the third embodiment, also, since individual writing is made possible for each memory cell like the first embodiment, influence of variations of the switching characteristic is reduced. In addition, since the volume of the data storage portion 4 can be made large and the shape anisotropy can also be made large, a data holding state is stabilized.

Fourth Embodiment

Figure 14:
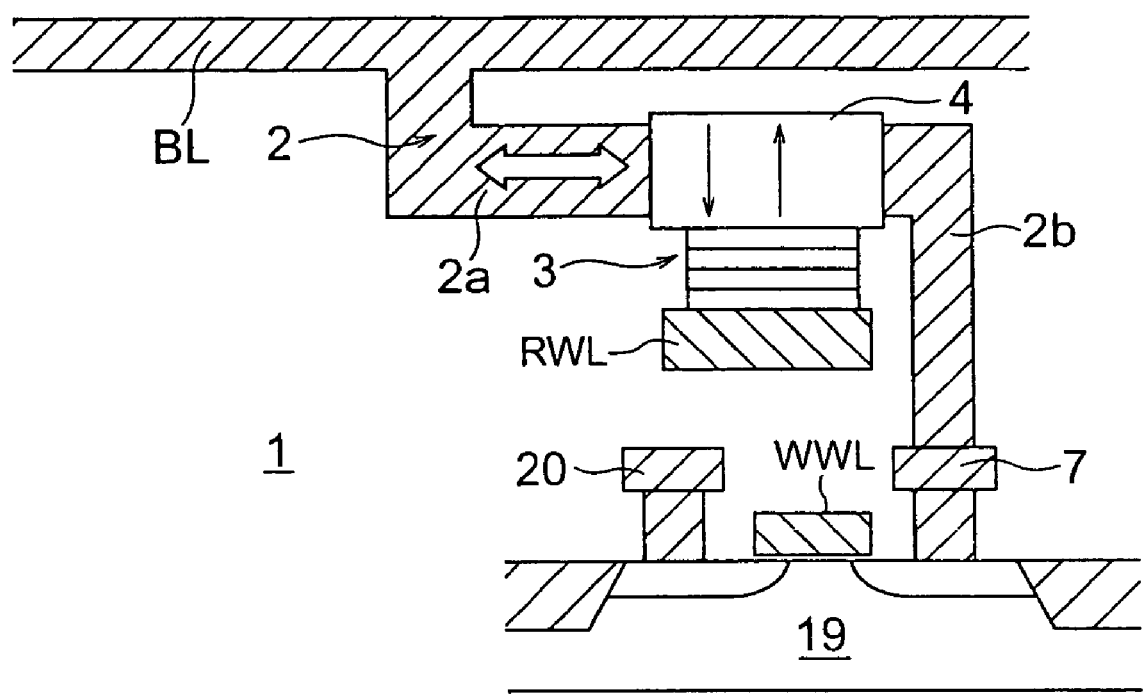
FIG. 14 is a sectional view showing a constitution of a memory cell of a magnetic memory according to a fourth embodiment of the present invention.

Next, a magnetic memory according to a fourth embodiment of the present invention will be explained with reference to FIG. 14. FIG. 14 is a sectional view showing a constitution of a memory cell 1 of a magnetic memory according to the fourth embodiment. The magnetic memory according to the fourth embodiment has a constitution that the reading selection transistor 17 is removed and a reading word line RWL is provided in place of the reading selection transistor 17 in each memory cell 1 of the magnetic memory according to the first embodiment shown in FIGS. 9A and 9B. That is, the magnetic memory according to this embodiment is of a simple matrix cross point type where no reading selection transistor is used.

In the magnetic memory according to this embodiment thus constituted, in case that writing is conducted in a memory cell to be selected, a common bit line BL connected to the memory cell 1 to be selected and a writing word line WWL which selects the memory cell are turned ON. Thereby, a writing current flows in the cell bit line 2 and the magnetization of the data storage portion 4 is inverted by a magnetic field generated in a circumferential direction of the first wire 2a. Reading is conducted by a current flowing in the TMR element 3 of the memory cell 1 to be selected by turning ON the common bit line BL connected to the memory cell to be selected and the reading word line RWL which selects the memory cell, namely, data stored in the data storage portion 4 is read out by a potential of the common bit line BL.

In the fourth embodiments, since individual writing is made possible for each memory cell like the first embodiment, influence of variations of the switching characteristic is reduced. In addition, since the volume of the data storage portion 4 can be made large and the shape anisotropy can also be made large, a data holding state is stabilized.

Fifth Embodiment

Figure 15A:
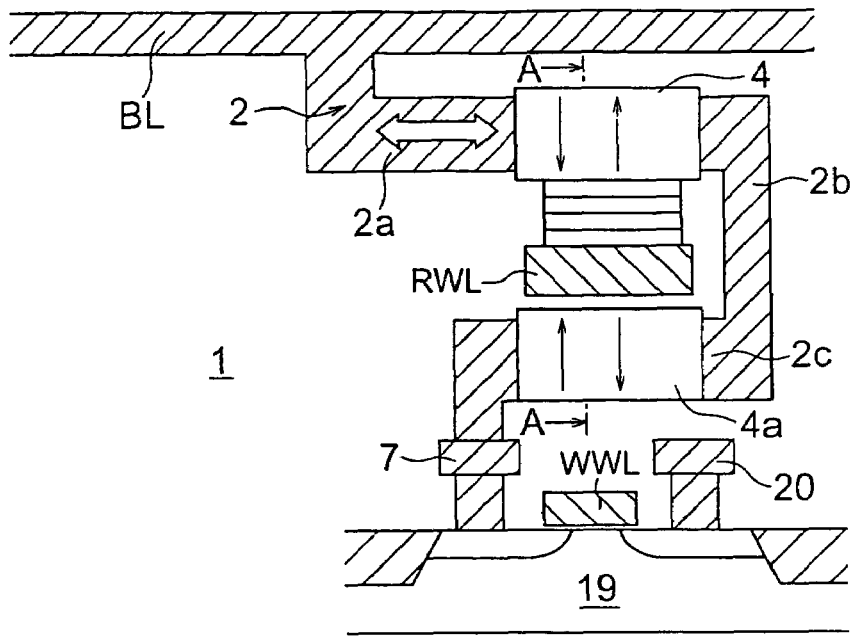
FIGS. 15A, 15B and 15C are sectional views showing a constitution of a memory cell of a magnetic memory according to a fifth embodiment of the present invention.

Next, a magnetic memory according to a fifth embodiment of the present invention will be explained with reference to FIGS. 15A, 15B and 15C. FIG. 15A is a sectional view showing a constitution of a memory cell 1 of a magnetic memory according to the fifth embodiment. The magnetic memory according to the fifth embodiment has a constitution that a third wiring portion 2c is provided between the second wiring portion 2b and the connection plug 7 and a second data storage portion 4a covering the third wiring portion 2c in the cell bit line 2 of each memory cell 1 of the magnetic memory according to the fourth embodiment shown in FIG. 14. Such a constitution is employed that the third wiring portion 2c is disposed below the reading word line RWL via an insulating film. That is, the two data storage portions 4 and 4a are provided on the same cell bit line 2 up and down, and the TMR element 3 is provided between the data storage portions 4 and 4a. Further, the third wiring portion 2c also has a portion substantially parallel to the common bit line BL.

Figure 15B:
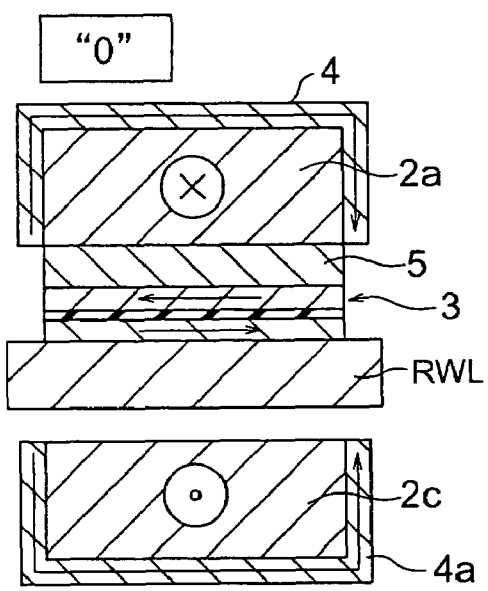
Figure 15C:
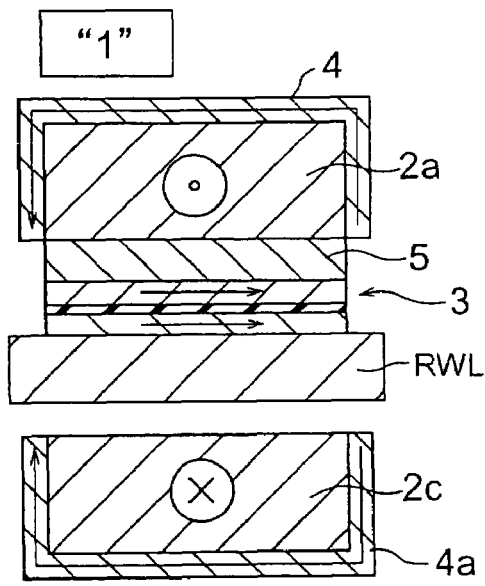

In the embodiment thus constituted, as shown in FIGS. 15B and 15C, since the magnetization directions generated from two upper and lower data storage portions 4 and 4a become the same in the vicinity of the TMR element 3, a sensitivity is improved. Incidentally, FIGS. 15B and 15C are sectional views taken along line A—A shown in FIG. 15A, FIG. 15B showing a case that data "0" is written in the data storage portions 4 and 4a, and FIG. 15C showing a case that data "1" is written in data storage portions 4 and 4a.

In the fifth embodiment, also, since individual writing is made possible for each memory cell like the fourth embodiment, influence of variations of the switching characteristic is reduced. In addition, since the volumes of the data storage portions 4 and 4a can be made large and the shape anisotropy can also be made large, a data holding state is stabilized.

Incidentally, in the fifth embodiment, the magneto-resistance effect element 3 has been provided so as to be electrically connected to the first wiring portion 2a, but such a constitution can be employed that the magneto-resistance effect element 3 is not electrically connected to the first wiring portion 2a but it is electrically connected to the third wiring portion 2c.

Sixth Embodiment

Figure 16A:
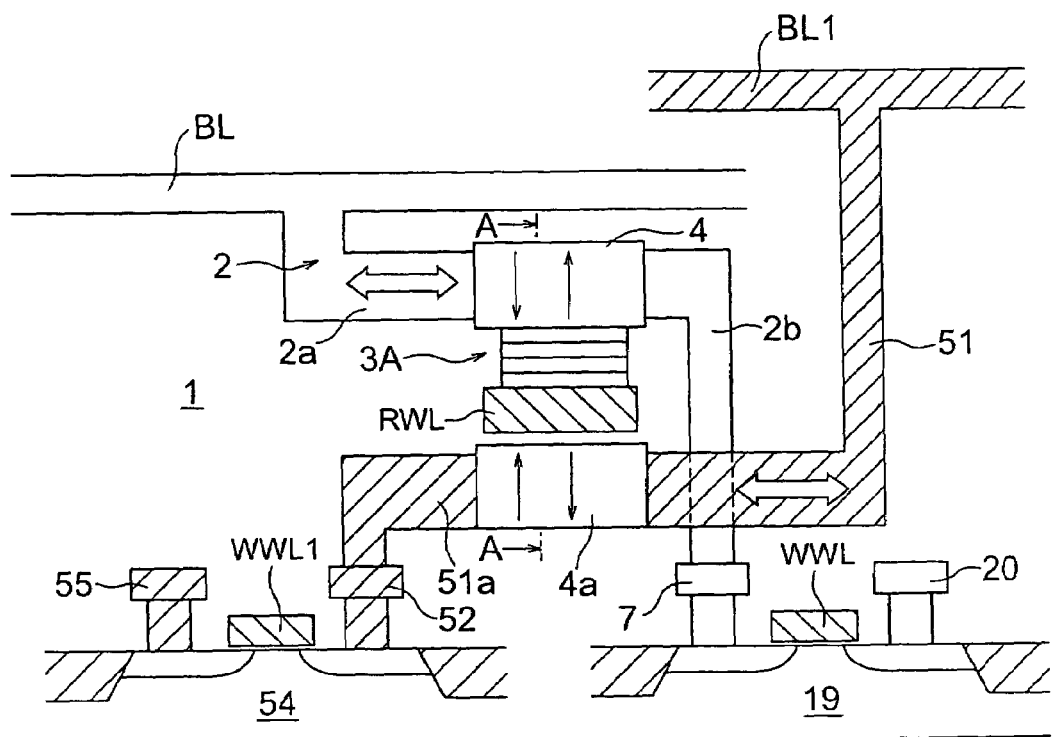
FIGS. 16A, 16B and 16C are diagrams showing a constitution of a memory cell of a magnetic memory according to a sixth embodiment of the present invention.

Next, a magnetic memory according to a sixth embodiment of the present invention will be explained with reference to FIGS. 16A, 16B and 16C. FIG. 16A is a sectional view showing a constitution of a memory cell 1 of a magnetic memory according to the sixth embodiment. The magnetic memory according to the sixth embodiment comprises a plurality of memory cells 1, and each memory cell 1 is provided with cell bit lines 2 and 51 each serving as a wiring wire, a magnetic sensor 3A comprising a TMR element, data storage portions 4 and 4a, and writing selection transistors 19 and 54.

The cell bit line 2 is provided with a first wiring portion 2a branched from the common bit line BL to be electrically connected to the TMR element 3A, and a second wiring portion 2b connected to the first wiring portion 2a and connected to one of a source and a drain of the writing selection transistor 19 via a connection plug 7. The first wiring portion 2a has a portion substantially parallel to the common bit line BL. The second wiring portion 2b is provided along a side portion of the TMR element 3 via an insulating film (not shown).

The TMR element 3A is provided with a sensor layer 3c electrically connected to the first wiring portion 2a of the cell bit line 2 via a contact layer 5, a tunnel barrier layer 3b coming in contact with the sensor layer 3c, and a magnetization fixed layer (reference layer) 3a coming in contact with the tunnel barrier layer 3b. The sensor layer 3c and the magnetization easy axis of the magnetization fixed layer 3a are formed to be perpendicular to each other. Thereby, an external magnetic field H substantially parallel to the magnetization easy axis of the magnetization fixed layer 3a, which is applied to the TMR element 3A and a resistance value R of the TMR element 3A are put in a linear relationship, as shown in FIG. 16C. Incidentally, the magnetization fixed layer 3a is connected to the reading word line RWL.

The cell bit line 51 has a wiring portion 51a which is branched from a common bit line BL1 to be formed below the reading word line RWL via an insulating film (not shown) and is connected one of a source and a drain of a writing selection transistor 54 via a connection plug 52. The wiring portion 51a has a portion which is substantially parallel to the common bit line BL1.

Figure 16B:
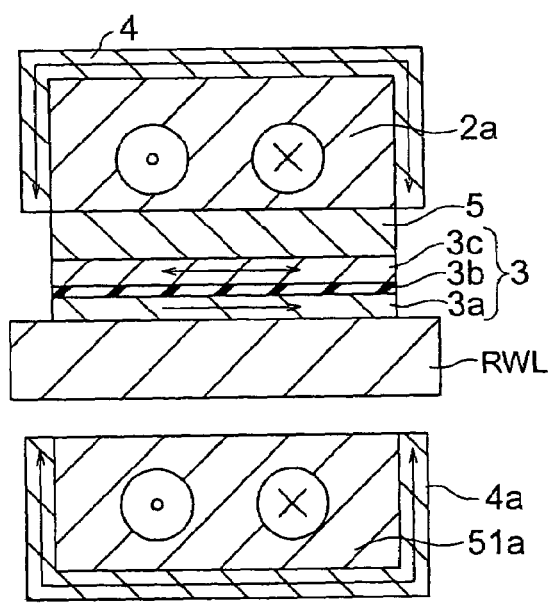
Figure 16C:
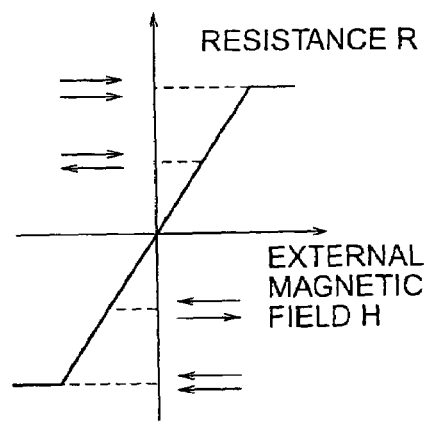

As shown in FIG. 16(b), the data storage portion 4 is formed so as to cover three faces of the first wiring portion 2a other than one face thereof coming in contact with the TMR element 3. Further, the data storage portion 4a is formed so as to cover three faces of the wiring portion 51a other than one face thereof opposed to the reading word line RWL.

The other of the source and the drain of the writing selection transistor 19 is connected to a common source line 20 used when a writing current is caused to flow, and the gate of the writing selection transistor 19 also serves as a writing selection word line WWL. Further, the other of the source and the drain of the writing selection transistor 54 is connected to a common source line 55 used when a writing-current is caused to flow, and the gate of the writing selection transistor 54 also serves as a writing selection word line $WWL_1$.

In the magnetic memory according to this embodiment thus constituted, the data storage portion 4 and 4a are provided above and below the TMR element 3A and data writing can be conducted on the data storage portions 4 and 4a independently from each other. Since distances from the respective two data storage portions 4 and 4a to the sensor layer 3c of the TMR element 3A are different from each other, there are four intensities of a magnetic field in the vicinity of the sensor layer 3c according to combinations of magnetization directions of two data storage portions 4 and 4a. For this reason, an output of the TMR element 3A can take four values (refer to FIG. 16C).

In the magnetic memory according the sixth embodiment, since individual writing is made possible for each memory cell like the first embodiment, influence of variations of the switching characteristic is reduced. In addition, since the volumes of the data storage portions 4 and 4a can be made large and the shape anisotropy can also be made large, a data holding state is stabilized.

Seventh Embodiment

Figure 17A:
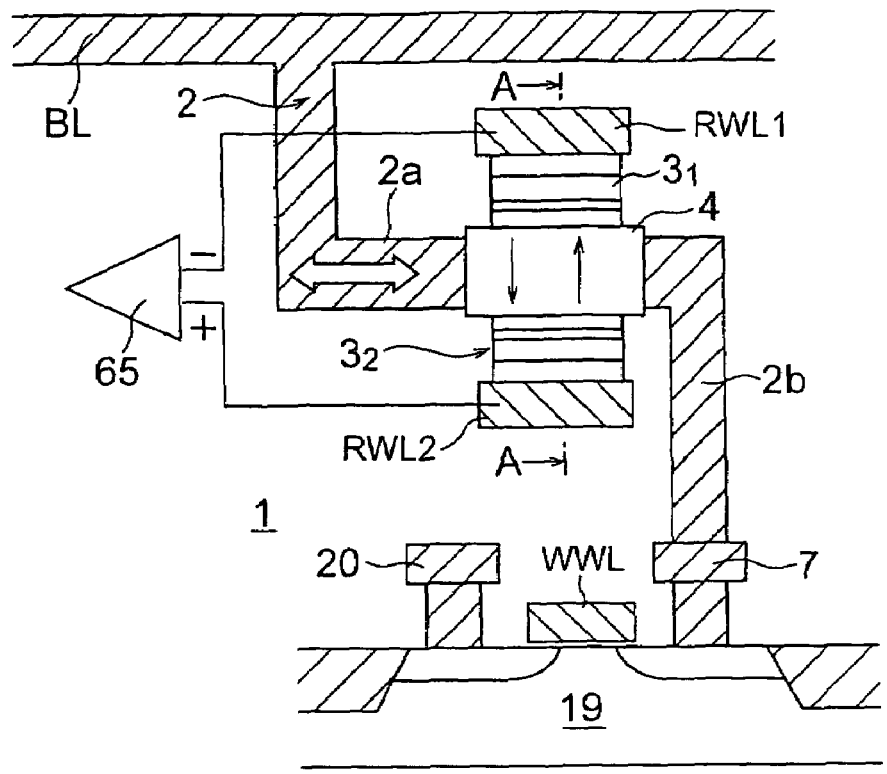
FIGS. 17A and 17B are sectional views showing a constitution of a memory cell of a magnetic memory according to a seventh embodiment of the present invention.
Figure 17B:
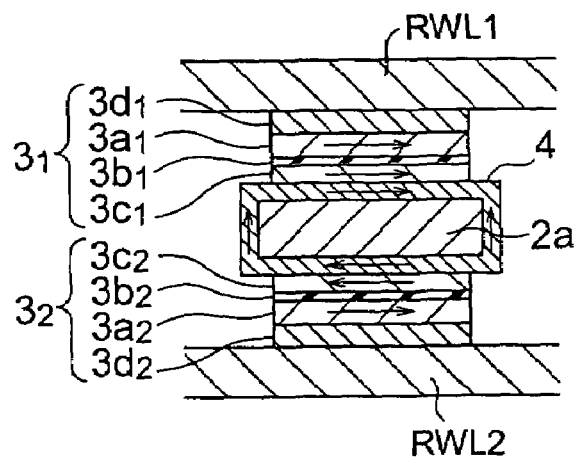

Next, a magnetic memory according to a seventh embodiment of the present invention will be explained with reference to FIGS. 17A and 17B. FIG. 17A is a sectional view showing a constitution of a memory cell 1 of a magnetic memory according to the seventh embodiment. FIG. 17B is a sectional view taken along line A—A shown in FIG. 17A. The magnetic memory according to the seventh embodiment has a plurality of memory cells 1, and each memory cell 1 is provided with a cell bit line 2 serving as a writing wire, magnetic sensors $3_1$ and $3_2$, each comprising a TMR element, a data storage portion 4 and a writing selection transistor 19.

The cell bit line 2 has a first wiring portion 2a branched from a common bit line BL and a second wiring portion 2b connected to the first wiring portion 2a and connected to one of the source and the drain of a writing selection transistor 19 via a connection plug 7. The first wiring portion 2a has a portion which is substantially parallel to the common bit line BL. The second wiring portion 2b is provided along a side portion of the TRM element 3 via an insulating film (not shown).

As shown in FIG. 17B, the data storage portion 4 is formed so as to cover a periphery of the first wiring portion $2a$ completely, and the data storage portion 4 is a closure type storage portion constituting a magnetic circuit of a closure type.

The TMR element $3_1$ is electrically connected, via a contact layer (not shown), to the data storage portion 4 positioned above the first wiring portion $2a$, and it is provided with a sensor layer $3c_1$ ferromagnetically coupled to the data storage portion 4 via a contact layer, a tunnel barrier layer $3b_1$ coming in contact with the sensor layer $3c_1$, a magnetization fixed layer $3a_1$ coming in contact with the tunnel barrier layer $3b_1$, and an anti-ferromagnetic layer $3d_1$ coming in contact with the magnetization fixed layer $3a_1$. Incidentally, the anti-ferromagnetic layer $3d_1$ is connected to a reading word line $RWL_1$.

The TMR element $3_2$ is provided with a sensor layer $3c_2$ electrically connected, via a contact layer (not shown), to the data storage portion 4 positioned below the first wiring portion $2a$ and ferromagnetically coupled to the data storage portion 4 via the contact layer, a tunnel barrier layer $3b_2$ coming in contact with the sensor layer $3c_2$, a magnetization fixed layer $3a_2$ coming in contact with the tunnel barrier layer $3b_2$, and an anti-ferromagnetic layer $3d_2$ coming in contact with the magnetization fixed layer $3a_2$. Incidentally, the anti-ferromagnetic layer $3d_2$ is connected to a reading word line $RWL_2$.

The other of the source and the drain of the writing selection transistor 19 is connected to a common source line 20 used when a writing current is caused to flow, and the gate of the writing selection transistor 19 also serves as a writing selection word line WWL.

In the magnetic memory according to this embodiment thus constituted, the TMR elements $3_1$ and $3_2$ are disposed above and below the data storage portion 4, and the directions of magnetic fields sensed by the respective TMR elements $3_1$ and $3_2$ are opposed to each other. The magnitude of an output is doubled by reading outputs from the respective TMR elements $3_1$ and $3_2$ by a differential amplifier 65.

In the magnetic memory according to the seventh embodiment, since individual writing is made possible for each memory cell like the first embodiment, influence of variations of the switching characteristic is reduced. In addition, since the volume of the data storage portion 4 can be made large and the shape anisotropy can also be made large, a data holding state is stabilized.

Eighth Embodiment

Figure 18A:
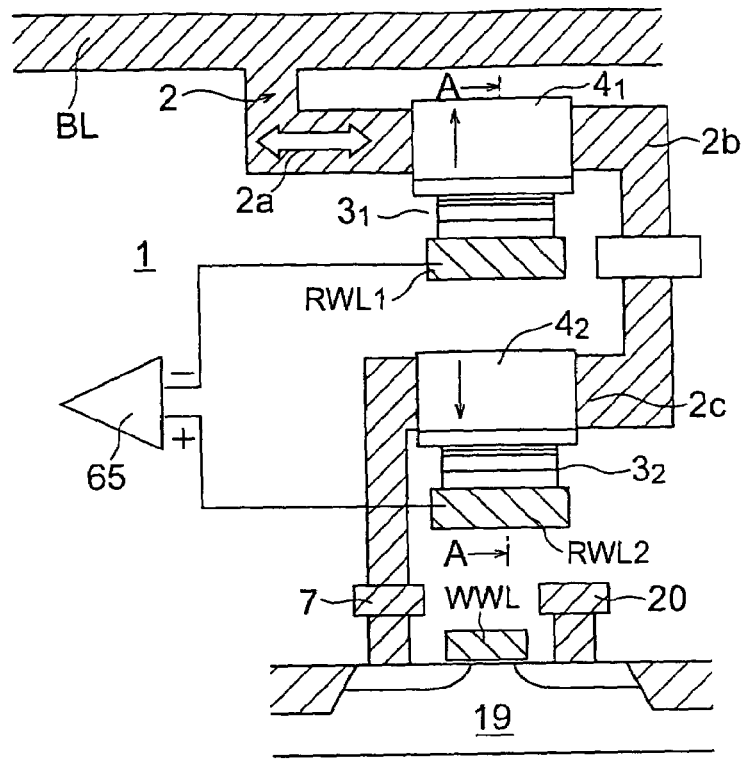
FIGS. 18A and 18B are sectional views showing a constitution of a memory cell of a magnetic memory according to an eighth embodiment of the present invention.
Figure 18B:
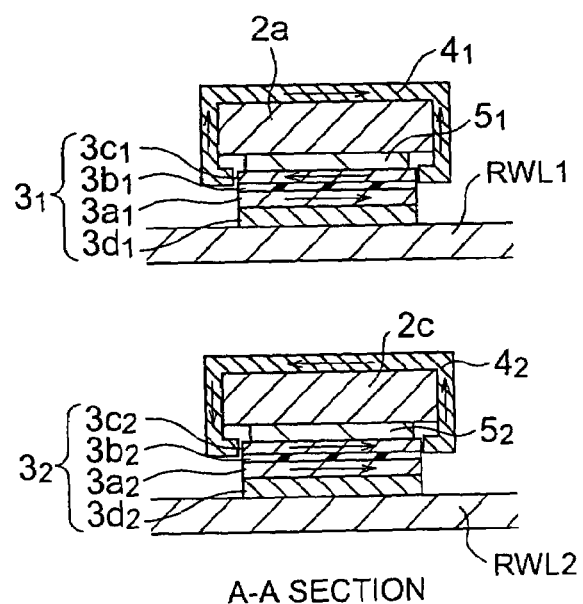

Next, a magnetic memory according to an eighth embodiment of the present invention will be explained with reference to FIGS. 18A and 18B. FIG. 18A is a sectional view showing a constitution of a memory cell 1 of a magnetic memory according to the eighth embodiment. FIG. 18B is a sectional view of the memory cell 1 taken along line A—A in FIG. 18A. The magnetic memory according to the eighth embodiment has a plurality of memory cells 1, and each memory cell 1 is provided with a cell bit line 2 serving as a writing wire, magnetic sensors $3_1$ and $3_2$, each comprising a TMR element, data storage portions $4_1$ and $4_2$, and a writing selection transistor 19.

The cell bit line 2 has a first wiring portion $2a$ branched from a common bit line BL to be electrically connected to the TMR element $3_1$, a second wiring portion $2b$ connected to the first wiring portion $2a$ and formed along a side portion of the TMR element $3_1$ via an insulating film (not shown), and a third wiring portion $2c$ having one end connected to the second wiring portion $2b$ and the other end connected to one of the source and the drain of the writing selection transistor 19 via a connection plug 7. The first wiring portion $2a$ has a portion which is substantially parallel to the common bit line BL. Further, the third wiring portion $2c$ also has a portion which is substantially parallel to the common bit line BL.

The TMR element $3_1$ is provided with a sensor layer $3c_1$ provided below the first wiring portion $2a$ and electrically connected to the first wiring portion $2a$ via a contact layer $5_1$, a tunnel barrier layer $3b_1$ coming in contact with the sensor layer $3c_1$, a magnetization fixed layer $3a_1$ coming in contact with the tunnel barrier layer $3b_1$, and a anti-ferromagnetic layer $3d_1$ coming in contact with the magnetization fixed layer $3a_1$. Incidentally, the anti-ferromagnetic layer $3d_1$ is connected to a reading word line $RWL_1$.

The TMR element $3_2$ is provided with a sensor layer $3c_2$ provided below the third wiring portion $2c$ and electrically connected to the third wiring portion $2c$ via a contact layer $5_2$, a tunnel barrier layer $3b_2$ coming in contact with the sensor layer $3c_2$, a magnetization fixed layer $3a_2$ coming in contact with the tunnel barrier layer $3b_2$, and an anti-ferromagnetic layer $3d_2$ coming in contact with the magnetization fixed layer $3a_2$. Incidentally, the anti-ferromagnetic layer $3d_2$ is connected to a reading word line $RWL_2$.

As shown in FIG. 18B, the data storage portion $4_1$ is formed so as to cover three faces of the TMR element $3_1$ other than one face thereof coming in contact with the contact layer $5_1$ and extend to the sensor layer $3c_1$. As shown in FIG. 18B, the data storage portion $4_2$ is formed so as to cover three faces of the TMR element $3_2$ other than one face thereof coming in contact with the contact layers $5_2$ and extend to the sensor layer $3c_2$.

The other of the source and the drain of the writing selection transistor 19 is connected to a common source line 20 used when a writing current is caused to flow, and the gate thereof also serves as a writing selection word line WWL.

In the magnetic memory according to this embodiment thus constituted, two data storage portions $4_1$ and $4_2$ are provided on one or the same cell bit line 2 and they are arranged such that their magnetization directions are opposed to each other. The two data storage portions $4_1$ and $4_2$ may be disposed on the same layer or may be positioned up and down, but a higher density can be achieved by positioning them up and down. The magnetic sensors $3_1$ and $3_2$ corresponding to the respective data storage portions $4_1$ and $4_2$ are provided and an output can be doubled by reading outputs therefrom by a differential amplifier 65.

In the magnetic memory according to the eighth embodiment, since individual writing is made possible for each memory cell like the first embodiment, influence of variations of the switching characteristic is reduced. In addition, since the volume of the data storage portion 4 can be made large and the shape anisotropy can also be made large, a data holding state is stabilized.

Ninth Embodiment

Figure 19A:
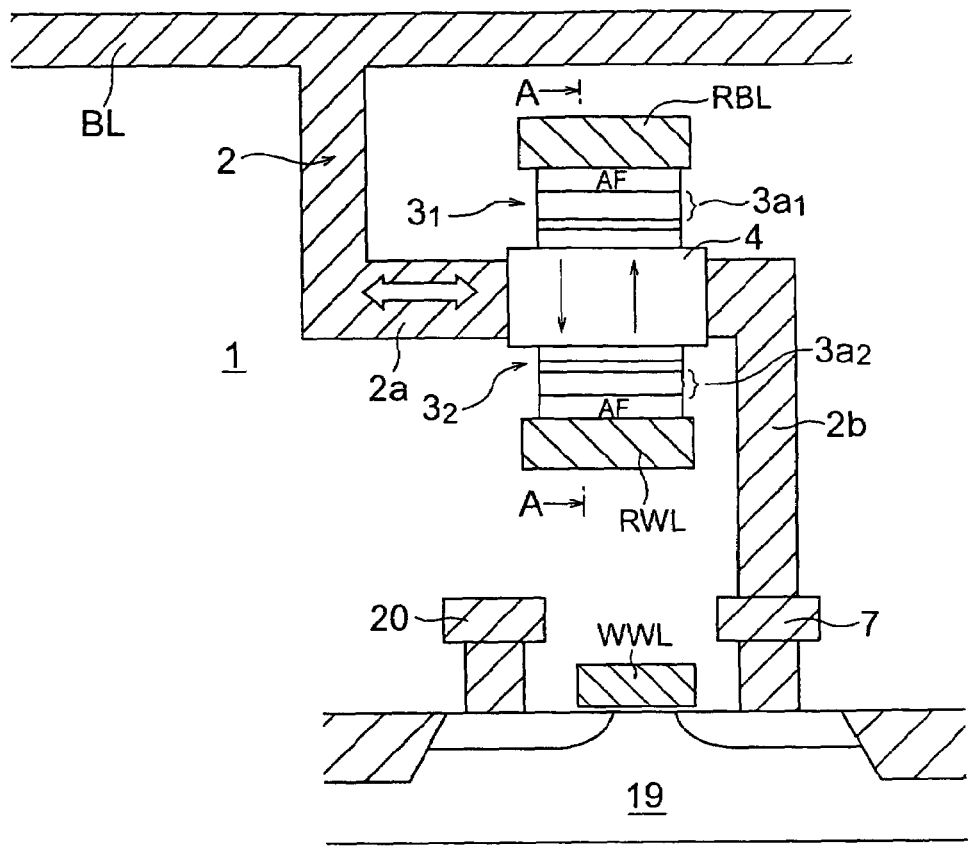
FIGS. 19A and 19B are sectional views showing a constitution of a memory cell of a magnetic memory according to a ninth embodiment of the present invention.
Figure 19B:
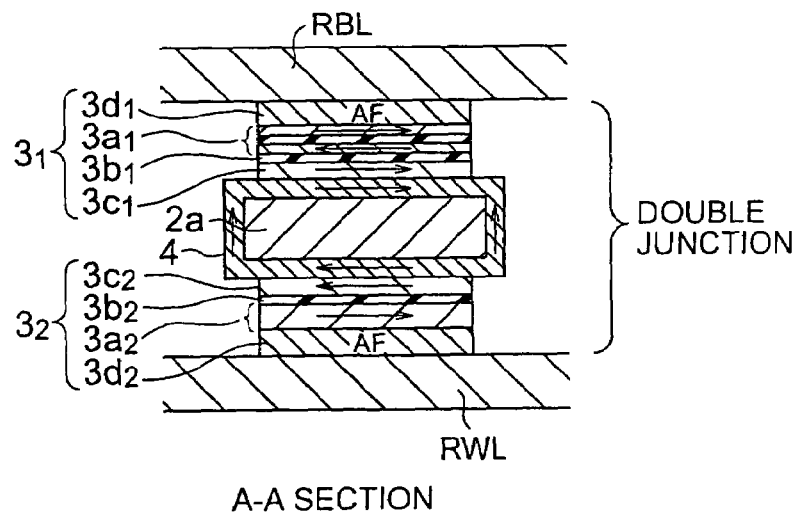

Next, a magnetic memory according to a ninth embodiment of the present invention will be explained with reference to FIGS. 19A and 19B. FIG. 19A is a sectional view showing a constitution of a memory cell 1 of a magnetic memory according to the ninth embodiment. FIG. 19B is a sectional view of the memory cell 1 taken along line A—A in FIG. 19A. The magnetic memory according to the ninth embodiment has a plurality of memory cells 1, and each memory cell 1 is provided with a cell bit line 2 serving as a writing wire, magnetic sensors $3_1$ and $3_2$, each comprising a TMR element, a data storage portion 4, and a writing selection transistor 19.

The cell bit line 2 has a first wiring portion $2a$ branched from a common bit line BL and a second wiring portion $2b$ connected to the first wiring portion $2a$ and connected to one of the source and the drain of a writing selection transistor 19 via a connection plug 7. The first wiring portion $2a$ has a portion which is substantially parallel to the common bit line BL. The second wiring portion $2b$ is provided along a side portion of the TMR element 3 via an insulating film (not shown).

As shown in FIG. 19B, the data storage portion 4 is formed so as to cover a periphery of the first wiring portion $2a$ completely and it is a closure type storage portion constituting a magnetic circuit of a closure type.

The TMR element $3_1$ is provided with a sensor layer $3c_1$ coming in contact with the data storage portion 4 above the firs wiring portion $2a$, a tunnel barrier layer $3b_1$ coming in contact with the sensor layer $3c_1$, a magnetization fixed layer $3a_1$ coming in contact with the tunnel barrier layer $3b_1$, and an anti-ferromagnetic layer $3d_1$ coming in contact with the magnetization fixed layer $3a_1$. Incidentally, the anti-ferromagnetic layer $3d_1$ is connected to a reading bit line RBL. The magnetization fixed layer $3a_1$ has a synthetic structure that two ferromagnetic layers are stacked via a non-magnetic layer.

The TMR element $3_2$ is provided with a sensor layer $3c_2$ coming in contact with the data storage portion 4 below the first wiring portion $2a$, a tunnel barrier layer $3b_2$ coming in contact with the sensor layer $3c_2$, a magnetization fixed layer $3a_2$ coming in contact with the tunnel barrier layer $3b_2$, and an anti-ferromagnetic layer $3d_2$ coming in contact with the magnetization fixed layer $3a_2$. Incidentally, the anti-ferromagnetic layer $3d_2$ is connected to a reading word line RWL. The magnetization fixed layer $3a_2$ is constituted with a single-layered ferromagnetic layer. Therefore, the TMR element $3_1$ and the TMR element $3_2$ constitute a double junction TMR element where they have been connected to each other via the data storage portion 4 serving as a closure type magnetization free layer.

The other of the source and the drain of the writing selection transistor 19 is connected to a common source line 20 used when a writing current is caused to flow, and the gate thereof also serves as a writing selection word line WWL.

In the magnetic memory according to this embodiment thus constituted, data writing into the data storage portion 4 in a selected memory cell is conducted by turning the writing selection word line WWL ON to cause a writing current to flow in the cell bit line 2. Reading of data from the data storage portion 4 is conducted by causing a current to flow in the double junction type TMR element having the closure magnetization free layer, positioned between the reading bit line RBL and the reading word line RWL to detect a potential difference corresponding to a resistance of the TMR element having the double junction.

Incidentally, in this embodiment, the magnetization fixed layer $3a_1$ of the TMR element $3_1$ has the synthetic structure that the two ferromagnetic layers have been stacked via the non-magnetic layer and the magnetization fixed layer $3a_2$ of the TMR element $3_2$ has the single-layered ferromagnetic layer, but such a constitution may be employed that the magnetization fixed layer $3a_2$ of the TMR element $3_2$ has a synthetic structure and the magnetization fixed layer $3a_1$ of the TMR element $3_1$ has a single-layered ferromagnetic layer.

In the magnetic memory according to the ninth embodiment, since individual writing is made possible for each memory cell, influence of variations of the switching characteristic is reduced. In addition, since the volume of the data storage portion 4 can be made large and the shape anisotropy can also be made large, a data holding state is stabilized. In addition, an output from each memory cell can be doubled because of a double junction type TMR element.

Tenth Embodiment

Figure 20A:
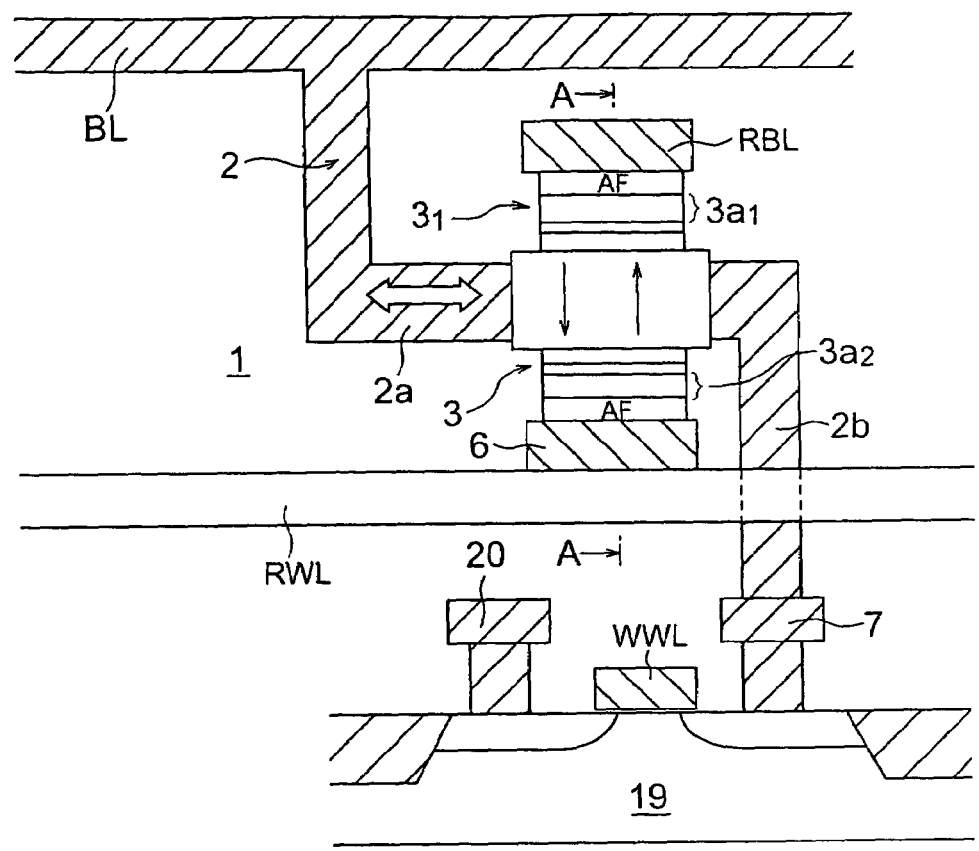
FIGS. 20A and 20B are sectional views showing a constitutions of a memory cell of a magnetic memory according to a tenth embodiment of the present invention.
Figure 20B:
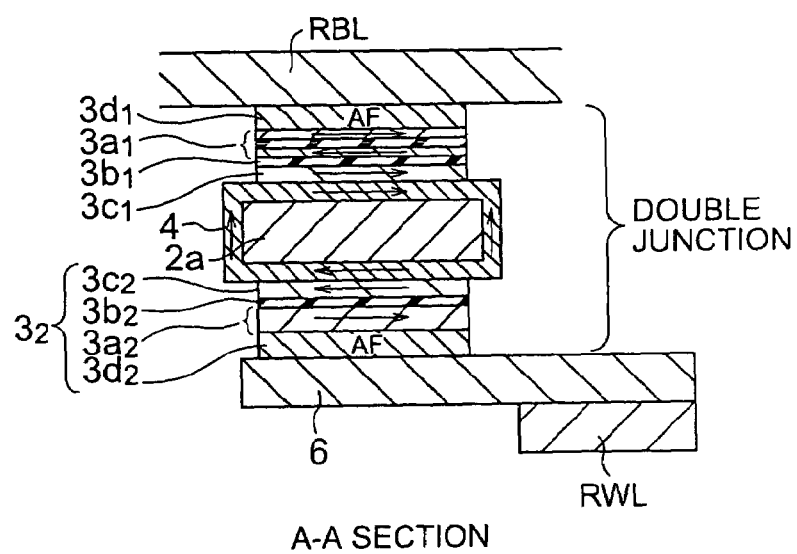
Figure 21A:
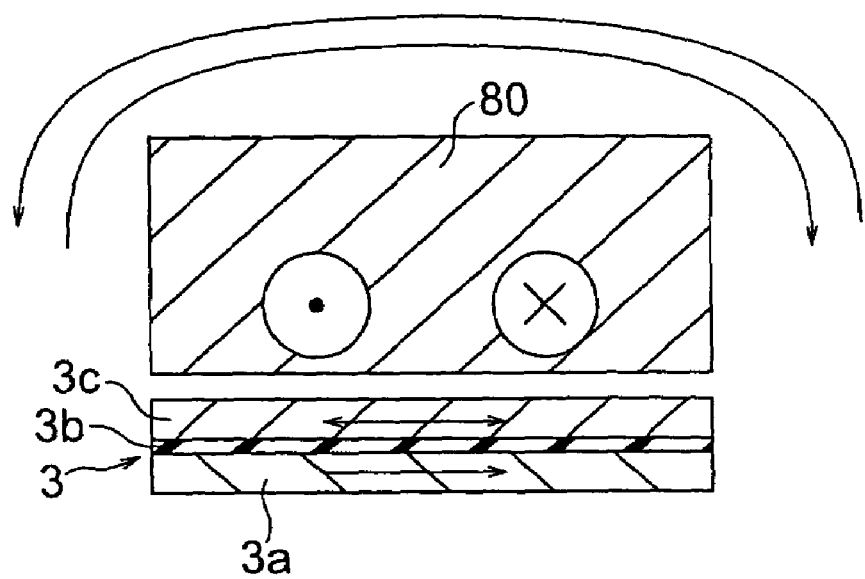
FIGS. 21A and 21B are sectional views showing a constitution of a conventional memory cell.
Figure 21B:
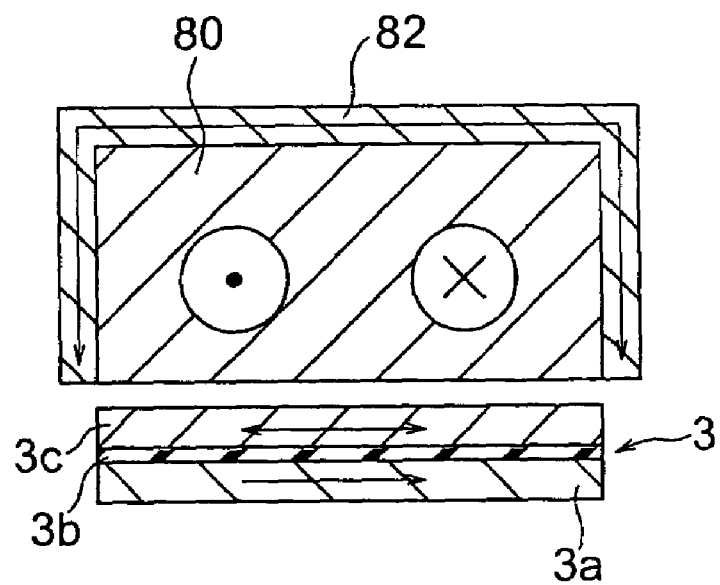

Next, a magnetic memory according to a tenth embodiment of the present invention will be explained with reference to FIGS. 20A and 20B. FIG. 20A is a sectional view showing a constitution of a memory cell 1 of a magnetic memory according to the tenth embodiment. FIG. 20B is a sectional view of the memory cell 1 taken along line A—A in FIG. 20A. The magnetic memory according to the tenth embodiment has a constitution that the anti-ferromagnetic layer $3d_2$ of the TMR element $3_2$ is connected to the reading word line RWL via a buffer layer 6 and the reading word line RWL is arranged to be substantially perpendicular to the reading bit line RBL in the magnetic memory of the ninth embodiment shown in FIG. 19.

Writing and reading of data into and from the memory cell of the magnetic memory according to this embodiment thus constituted are conducted in the same manner as the case in the ninth embodiment.

In the magnetic memory according to the tenth embodiment, since individual writing is made possible for each memory cell, influence of variations of the switching characteristic is reduced. In addition, since the volume of the data storage portion 4 can be made large and the shape anisotropy can also be made large, a data holding state is stabilized. In addition, an output from each memory cell can be doubled because of a double junction type TMR element.

Incidentally, in the first to tenth embodiments, the cases that the TMR element has been used as the magnetoresistance effect element have been explained, but this invention is not limited to these cases. A magnetic sensor such as a giant magneto-resistance effect element having a giant magneto-resistance effect or the like may be used in this invention.

Eleventh Embodiment

Next, a manufacturing method of a magnetic memory according to an eleventh embodiment of the present invention will be explained. The manufacturing method according to the eleventh embodiment is for manufacturing the magnetic memory according to the fifth embodiment shown in FIGS. 15A to 15C. This embodiment will be explained below with reference to FIGS. 15A to FIG. 15C.

A p-type silicon substrate is first prepared. Next, an N-channel MOSFET serving as the writing selection transistor 19 is formed by an ordinary CMOS process. At that time, a gate electrode is formed so as to serve as the writing selection word line WWL as it is. The electrode 7 is formed on the drain and the source and the common source line 20 is wired.

Next, an insulating layer (not shown) is formed. Thereafter, the third wiring portion $2c$ is formed. As a material used for the third wiring portion $6c$, Al, Al—Cu, Cu, Ag or the like can be proposed, but Cu formed by a damascene process is used here. The third wiring portion $2c$ is constituted as a wire covered with the data storage portion $4a$ comprising NiFe which is a ferromagnetic material. Incidentally, TiN is disposed outside NiFe as barrier metal and CoFe is inserted between NiFe and Cu in the data storage portion $4a$ as barrier metal.

Next, an insulating film (not shown) is formed, the reading word line RWL is formed thereon, an insulating film (not shown) is then covered thereon, and planarization of the insulating film is performed such that the reading word line RWL is exposed. Next, a TMR stack film 3 is deposited. The TMR stack film 3 can be obtained by sequentially stacking a lower portion wiring connection layer with a film thickness of 20 nm comprising Ta, a buffer layer with a film thickness of 5 nm comprising Ru, an anti-ferromagnetic layer with a film thickness of 6 nm comprising IrMn, a magnetization fixed layer with a film thickness of 2 nm comprising $Co_{90}Fe_{10}$, a tunnel barrier layer with a film thickness of 1 nm comprising $Al_2O_3$, a magnetization free layer comprising $Ni_{79}Fe_{21}$ with a film thickness of 3 nm, a surface protecting layer with a film thickness of 2 nm comprising Ta, a surface protecting layer with a film thickness of 20 nm comprising Ru and an upper portion connection layer comprising Ta on the word line RWL.

Next, the TMR element 3 is formed by using Ta of the upper portion connection layer as a hard mask to etch the TMR stack film 3 in a predetermined shape, for example, in a rectangle 0.24×0.48 $\mu m^2$. Thereafter, an inter-layer insulating film (not shown) is deposited. A via hole with a rectangular parallelepiped for forming a cell bit line 2b in a vertical direction adjacent to the TMR element 3 is formed in the above-described inter-layer insulating film. Then, the via hole is buried with tungsten (W) and the cell bit line 2b is formed.

Next, the inter-layer insulating film is etched so as to achieve a contact with the upper connection layer in the TMR element 3. A metal film comprising Al is deposited so as to connect to the upper connection layer in the TMR element 3 and connect to the cell bit line 2b in a vertical direction in order to form the common bit line BL and the cell bit line 2a. Subsequently, the metal film comprising Al is etched so as to form the common bit line BL and the cell bit line. Such an arrangement is achieved that the common bit line BL is positioned between the respective TMR elements 3 and the cell bit line 2 branched from the common bit line BL extends just above Each TMR element 3, as viewed from the above.

Next, a wiring that the data storage portion 4 has been formed by covering the uppermost layer and side faces of the cell bit line 2a with a NiFe film which is a ferromagnetic material can be obtained. Incidentally, a CoFe film serving as barrier metal is inserted between the date storage portion 4 comprising NiFe and the cell bit line 2a. Further, instead of CoFe, Ta, TiN, TaN, W, WN and the like can be used as the barrier metal. Incidentally, a barrier metal comprising TiN can be formed on the data storage portion 4.

After the data storage portion 4 has been formed, a protecting layer (not shown) is deposited. Subsequently, one axis magnetism anisotropy in the same or one direction is given to the TMR element 3, and the data storage portions 4 and 4a in a collective manner by performing anneal in a magnetic field. The annealing conditions include, for example, that anneal is conducted for one hour at 300° C. and in a magnetic field of 10 kOe. A magnetization state is finally initialized by causing writing currents for writing data "0" or "1" in all cell bit lines to flow therein.

As described above, according to the embodiment of the present invention, the storing state of a memory cell can be stabilized and a writing current and/or a power consumption can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetic memory comprising:
   a plurality of common bit lines; and
   a plurality of memory cells, each memory cell comprising,
   at least one cell bit line being branched from a corresponding one of the common bit lines and functioning as a writing wire,
   at least one data storage portion, provided on at least one portion of an outer periphery of the cell bit line, which comprises a ferromagnetic material whose magnetization direction can be inverted by causing a current to flow in the cell bit line,
   at least one magneto-resistance effect element, disposed in the vicinity of the data storage portion, which senses the magnetization direction of the data storage portion, and
   a writing selection transistor which is connected at one of a source and a drain thereof with the at least one cell bit line.

2. The magnetic memory according to claim 1, wherein the data storage portion is provided so as to surround at least three directions of four directions of the outer periphery of the cell bit line, the magneto-resistance effect element is disposed in the remaining one direction of the outer periphery, the magnetization direction of the data storage portion is substantially parallel to a circumferential direction of the cell bit line, and the magnetization direction appearing at both ends of the data storage portion is sensed by the magneto-resistance effect element.

3. The magnetic memory according to claim 1, wherein the data storage portion is provided so as to surround four directions of the outer periphery of the cell bit line, the magneto-resistance effect element is provided so as to correspond to one direction of the four directions, and the data storage portion and a magnetization free layer of the magneto-resistance effect element are magnetically coupled.

4. The magnetic memory according to claim 1, wherein a magnetization free layer of the magneto-resistance effect element contacts with the data storage portion.

5. The magnetic memory according to claim 1, further comprising a sense assist wire which is provided in the vicinity of the magneto-resistance effect element and generates a magnetic field due to a current flowing therein and which assists sensing of the magnetization direction of the data storage portion.

6. The magnetic memory according to claim 1, further comprising a write assist line which is provided in the vicinity of the data storage portion so as to be substantially perpendicular to the cell bit line and generates a magnetic field in a direction perpendicular to the magnetization direction of the data storage portion.

7. A magnetic memory comprising:
   a plurality of common bit lines; and
   a plurality of memory cells, each memory cell comprising,
   at least one cell bit line being branched from a corresponding one of the common bit lines and functioning as a writing wire,
   at least one data storage portion, provided on at least one portion of an outer periphery of the cell bit line, which comprises a ferromagnetic material whose magnetization direction can be inverted by causing a current to flow in the cell bit line,
   at least one magneto-resistance effect element, disposed in the vicinity of the data storage portion, which senses the magnetization direction of the data storage portion, and
   a writing selection transistor which is connected at one of a source and a drain thereof with the at least one cell bit line, wherein the cell bit line has a first wiring portion which is branched from a corresponding one of the common bit lines, a second wiring portion which is provided along a side portion of the magneto-resistance effect element via an insulating film and has one end connected to the first wiring portion, and a third wiring portion which has one end connected to the other end of the second wiring portion and is provided substantially in parallel with the first wiring portion such that the third wiring portion and the first wiring portion sandwich the magneto-resistance effect element, and wherein the magneto-resistance effect element is electrically connected to one of the first wiring portion and the third wiring portion, the data storage portion has a first storage portion provided on an outer peripheral portion of the first wiring portion and a second storage portion provided on an outer peripheral portion of the third wiring portion, and the magneto-resistance effect element is provided in the vicinity of the first storage portion and in the vicinity of the second storage portion.

8. A magnetic memory comprising:
a plurality of common bit lines; and
a plurality of memory cells, each memory cell comprising,
    at least one cell bit line being branched from a corresponding one of the common bit lines and functioning as a writing wire,
    at least one data storage portion, provided on at least one portion of an outer periphery of the cell bit line, which comprises a ferromagnetic material whose magnetization direction can be inverted by causing a current to flow in the cell bit line,
    first and second magneto-resistance effect elements which sense the magnetization direction of the data storage portion, and
    a writing selection transistor which is connected at one of a source and a drain thereof with the at least one cell bit line,
wherein the cell bit line comprises a first wiring portion, a second wiring portion, and a third wiring portion, the first wiring portion being branched from the corresponding one of the common bit lines and electrically connected to the first magneto-resistance effect element, the second wiring portion being provided along a side portion of the first magneto-resistance effect element via an insulating film and having one end connected to the first wiring portion, and the third wiring portion having one end connected to the other end of the second wiring portion, being provided substantially in parallel with the first wiring portion and being electrically connected with the second magneto-resistance effect element,
the data storage portion has a first storage portion and a second storage portion, the first storage portion provided on an outer peripheral portion of the first wiring portion and the second storage portion provided on an outer peripheral portion of the third wiring portion, and
the first magneto-resistance effect element is provided in the vicinity of the first storage portion and the second magneto-resistance effect element is provided in the vicinity of the second storage portion.

9. The magnetic memory according to claim 8, further comprising a differential amplifier which reads outputs of the first and second magneto-resistance effect element in a differential manner.

10. A magnetic memory comprising:
a plurality of common bit lines; and
a plurality of memory cells, each memory cell comprising,
    at least one cell bit line being branched from a corresponding one of the common bit lines and functioning as a writing wire,
    at least one data storage portion, provided on at least one portion of an outer periphery of the cell bit line, which comprises a ferromagnetic material whose magnetization direction can be inverted by causing a current to flow in the cell bit line,
    at least one magneto-resistance effect element, disposed in the vicinity of the data storage portion, which senses the magnetization direction of the data storage portion, and
    a writing selection transistor which is connected at one of a source and a drain thereof with the at least one cell bit line,
wherein each memory cell is caused to correspond to first and second common bit lines, the cell bit line has a first wiring portion which is branched from the first common bit line to be electrically connected with the magneto-resistance effect element and a second wiring portion which is branched from the second common bit line and has a portion provided substantially in parallel with the first wiring portion such that the first wiring portion and the second wiring portion sandwich the magneto-resistance effect element, the data storage portion comprises first and second data storage portions provided on at least one portion of an outer periphery of the first and second wiring portions respectively, the magneto-resistance effect element is provided in the vicinity of the first storage portion and in the vicinity of the second storage portion, the magneto-resistance effect element has a magnetization fixed layer in which magnetization direction has been fixed and a magnetization free layer which senses the magnetization directions of the first storage portion and the second storage portion, and a magnetization easy axis of the magnetization fixed layer and a magnetization easy axis of the magnetization free layer are substantially perpendicular to each other.

11. A magnetic memory comprising:
a plurality of common bit lines; and
a plurality of memory cells, each memory cell comprising,
    at least one cell bit line being branched from a corresponding one of the common bit lines and functioning as a writing wire,
    at least one data storage portion, provided on at least one portion of an outer periphery of the cell bit line, which comprises a ferromagnetic material whose magnetization direction can be inverted by causing a current to flow in the cell bit line,
    first and second magneto-resistance effect elements each disposed in the vicinity of the data storage portion, which sense the magnetization direction of the data storage portion respectively, and
    a writing selection transistor which is connected at one of a source and a drain thereof with the at least one cell bit line.

12. The magnetic memory according to claim 11, further comprising a differential amplifier which reads outputs of the first and second magneto-resistance effect elements in a differential manner.

* * * * *